(12) United States Patent
Kim et al.

(10) Patent No.: US 11,201,127 B2
(45) Date of Patent: Dec. 14, 2021

(54) DEVICE COMPRISING CONTACT TO CONTACT COUPLING OF PACKAGES

(71) Applicant: QUALCOMM Incorporated, San Diego, CA (US)

(72) Inventors: Jonghae Kim, San Diego, CA (US); Milind Shah, San Diego, CA (US); Periannan Chidambaram, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 16/812,882

(22) Filed: Mar. 9, 2020

(65) Prior Publication Data
US 2021/0280540 A1 Sep. 9, 2021

(51) Int. Cl.
| | |
|---|---|
| *H01L 23/48* | (2006.01) |
| *H01L 23/52* | (2006.01) |
| *H01L 29/40* | (2006.01) |
| *H01L 23/00* | (2006.01) |
| *H01L 23/31* | (2006.01) |
| *H01L 23/64* | (2006.01) |
| *H01L 21/56* | (2006.01) |
| *H01L 23/532* | (2006.01) |

(52) U.S. Cl.
CPC ............. *H01L 24/05* (2013.01); *H01L 21/56* (2013.01); *H01L 23/3135* (2013.01); *H01L 23/53228* (2013.01); *H01L 23/645* (2013.01); *H01L 2224/05* (2013.01)

(58) Field of Classification Search
CPC combination set(s) only.
See application file for complete search history.

(56) References Cited

U.S. PATENT DOCUMENTS

| | | | | |
|---|---|---|---|---|
| 9,659,907 | B2* | 5/2017 | Zhai | H01L 23/5389 |
| 10,475,747 | B2* | 11/2019 | Yu | H01L 24/20 |
| 2010/0133704 | A1 | 6/2010 | Marimuthu et al. | |
| 2013/0277821 | A1* | 10/2013 | Lundberg | H01L 25/0657 257/713 |

(Continued)

OTHER PUBLICATIONS

International Search Report and Written Opinion—PCT/US2021/021495—ISA/EPO—dated Jun. 22, 2021.

*Primary Examiner* — Niki H Nguyen
(74) *Attorney, Agent, or Firm* — Loza & Loza, LLP

(57) ABSTRACT

A device that includes a first package and a second package coupled to the first package. The first package includes a first integrated device, a first encapsulation layer encapsulating the first integrated device, a plurality of vias traveling through the first encapsulation layer, a first redistribution portion comprising a first plurality of redistribution interconnects, wherein the first redistribution portion is coupled to the first encapsulation layer, and a first plurality of contacts coupled to the first integrated device. The second package includes a passive device, a second encapsulation layer encapsulating the passive device, a second redistribution portion comprising a second plurality of redistribution interconnects, wherein the second redistribution portion is coupled to the passive device and the second encapsulation layer, and a second plurality of contacts coupled to the passive device, wherein the second plurality of contacts is coupled to the first plurality of contacts from the first package.

39 Claims, 21 Drawing Sheets

SIDE PROFILE VIEW

(56) References Cited

U.S. PATENT DOCUMENTS

2016/0020193 A1    1/2016  Lee et al.
2017/0005023 A1*   1/2017  Chen .................... H01L 21/561
2019/0088621 A1    3/2019  Yang et al.

* cited by examiner

SIDE PROFILE VIEW

SIDE PROFILE VIEW

SIDE PROFILE VIEW

SIDE PROFILE VIEW

SIDE PROFILE VIEW

SIDE PROFILE VIEW

DEVICE COMPRISING CONTACT TO CONTACT COUPLING OF PACKAGES

FIELD

Various features relate to packages and integrated devices, but more specifically to package to package coupling through contact to contact coupling.

BACKGROUND

FIG. 1 illustrates a device 100 that includes a first package 101 and a second package 103. The first package 101 is coupled to the second package 103 through the plurality of solder interconnects 160. The first package 101 includes a substrate 102 and a die 104. The die 104 is coupled to a first surface of the substrate 102 through a plurality of solder interconnects 140, which may include bumps and pillars. The substrate 102 includes a plurality of dielectric layers 120 and a plurality of interconnects 122. The substrate 102 includes a first solder resist layer 124, a second solder resist layer 126, and a plurality of solder interconnects 130. The second package 103 includes a substrate 105, a die 106, and a capacitor 180. The substrate 105 includes a plurality of dielectric layers 150 and a plurality of interconnects 152. The die 106 and the capacitor 180 are coupled to the substrate 105. The position and location of the capacitor 180 in the second package 103, may limit the performance of the device 100 because of the distance currents between the capacitor 180 and the die 104 have to travel. There is an ongoing need to improve the performance of packages and devices.

SUMMARY

Various features relate to packages and integrated devices, but more specifically to package to package coupling through contact to contact coupling.

One example provides a device that includes a first package and a second package coupled to the first package through contact to contact coupling. The first package includes a first integrated device comprising a front side and a back side, a first encapsulation layer encapsulating the first integrated device, a plurality of vias traveling through the first encapsulation layer, a first redistribution portion comprising a first plurality of redistribution interconnects, wherein the first redistribution portion is coupled to the first encapsulation layer, and a first plurality of contacts coupled to the first integrated device. The second package includes a passive device, a second encapsulation layer encapsulating the passive device, a second redistribution portion comprising a second plurality of redistribution interconnects, wherein the second redistribution portion is coupled to the passive device and the second encapsulation layer, and a second plurality of contacts coupled to the passive device, wherein the second plurality of contacts is coupled to the first plurality of contacts from the first package.

Another example provides an apparatus that includes a first package and a second package coupled to the first package through contact to contact coupling. The first package includes a first integrated device comprising a front side and a back side, first means for encapsulation encapsulating the first integrated device, a plurality of vias traveling through the first means for encapsulation, a first redistribution portion comprising a first plurality of interconnects, wherein the first redistribution portion is coupled to the first means for encapsulation, and a first plurality of contacts coupled to the first integrated device. The second package includes a passive device, second means for encapsulation encapsulating the passive device, a second redistribution portion comprising a second plurality of interconnects, wherein the second redistribution portion is coupled to the passive device and the second means for encapsulation, and a second plurality of contacts coupled to the passive device, wherein the second plurality of contacts is coupled to the first plurality of contacts from the first package.

Another example provides a method for fabricating a device. The method provides a first package that includes a first integrated device comprising a front side and a back side, a first encapsulation layer encapsulating the first integrated device, a plurality of vias traveling through the first encapsulation layer, a first redistribution portion comprising a first plurality of interconnects, wherein the first redistribution portion is coupled to the first encapsulation layer, and a first plurality of contacts coupled to the first integrated device. The method provides a second package that includes a passive device, a second encapsulation layer encapsulating the passive device, a second redistribution portion comprising a second plurality of interconnects, wherein the second redistribution portion is coupled to the passive device and the second encapsulation layer, and a second plurality of contacts coupled to the passive device, wherein the second plurality of contacts is coupled to the first plurality of contacts from the first package. The method couples the first package to the second package through contact to contact coupling.

BRIEF DESCRIPTION OF THE DRAWINGS

Various features, nature and advantages may become apparent from the detailed description set forth below when taken in conjunction with the drawings in which like reference characters identify correspondingly throughout.

DETAILED DESCRIPTION

In the following description, specific details are given to provide a thorough understanding of the various aspects of the disclosure. However, it will be understood by one of ordinary skill in the art that the aspects may be practiced without these specific details. For example, circuits may be shown in block diagrams in order to avoid obscuring the aspects in unnecessary detail. In other instances, well-known circuits, structures and techniques may not be shown in detail in order not to obscure the aspects of the disclosure.

The present disclosure describes a device that includes a first package and a second package coupled to the first package through contact to contact coupling. The first package includes a first integrated device (e.g., first die) comprising a front side and a back side, a first encapsulation layer encapsulating the first integrated device, a plurality of vias traveling through the first encapsulation layer, a first redistribution portion comprising a first plurality of redistribution interconnects, where the first redistribution portion is coupled to the first encapsulation layer, and a first plurality of contacts coupled to the first integrated device. The second package includes a passive device (e.g., integrated passive device (IPD), passive die), a second encapsulation layer encapsulating the passive device, a second redistribution portion comprising a second plurality of redistribution interconnects, where the second redistribution portion is coupled to the passive device and the second encapsulation layer, and a second plurality of contacts coupled to the passive device, where the second plurality of contacts is coupled to the first plurality of contacts from the first package. One advantage of this configuration is that the passive device is a lot closer to the integrated device, which may help reduce parasitic effects of components and may help improve the overall performance of the integrated device, the package(s) and the device. Another advantage of this configuration is the reduced cost of fabricating the package.

Exemplary Device Comprising Contact to Contact Coupling of Packages

Figure 1:
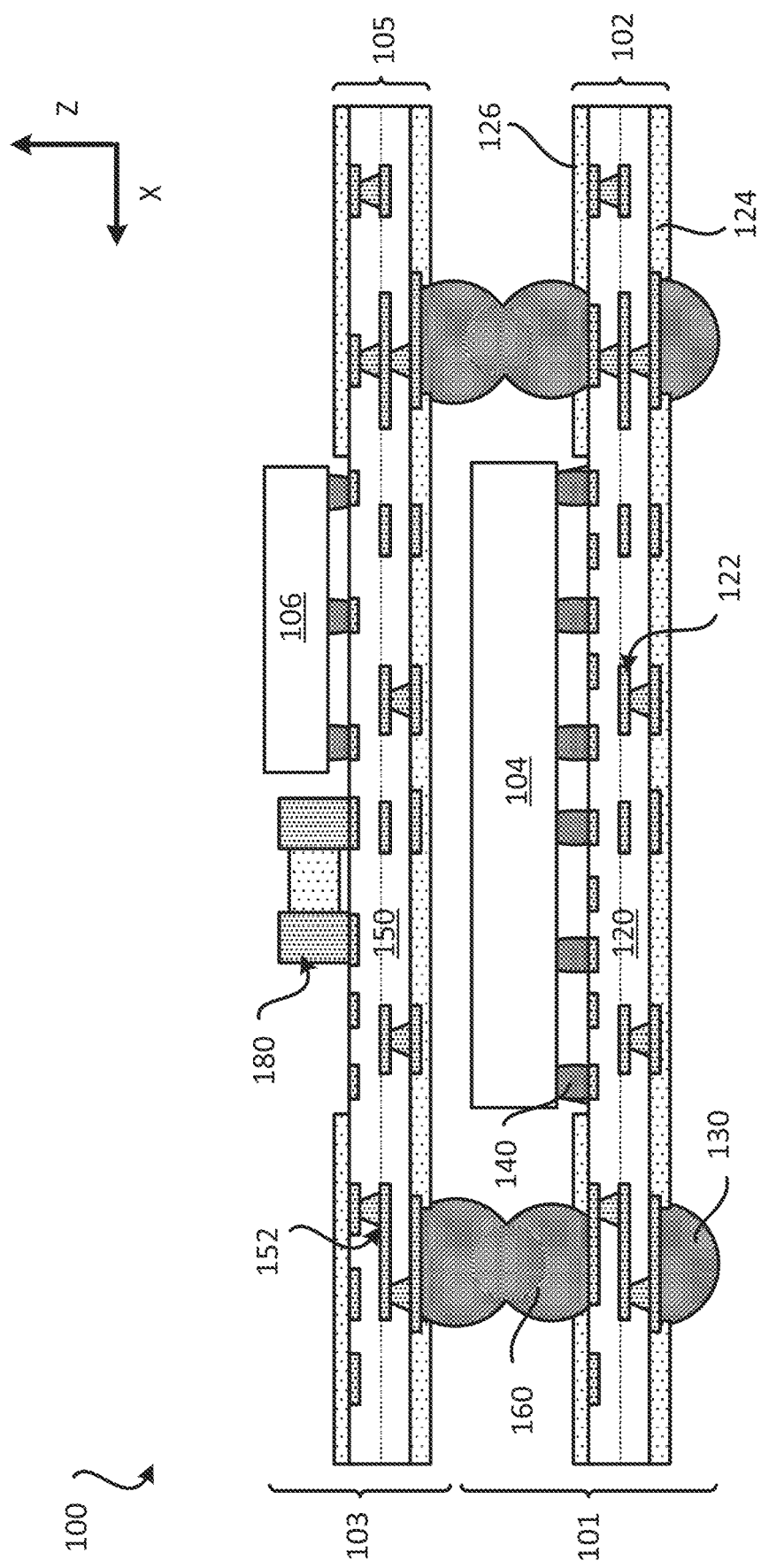
FIG. 1 illustrates a package coupled to another package.
Figure 2:
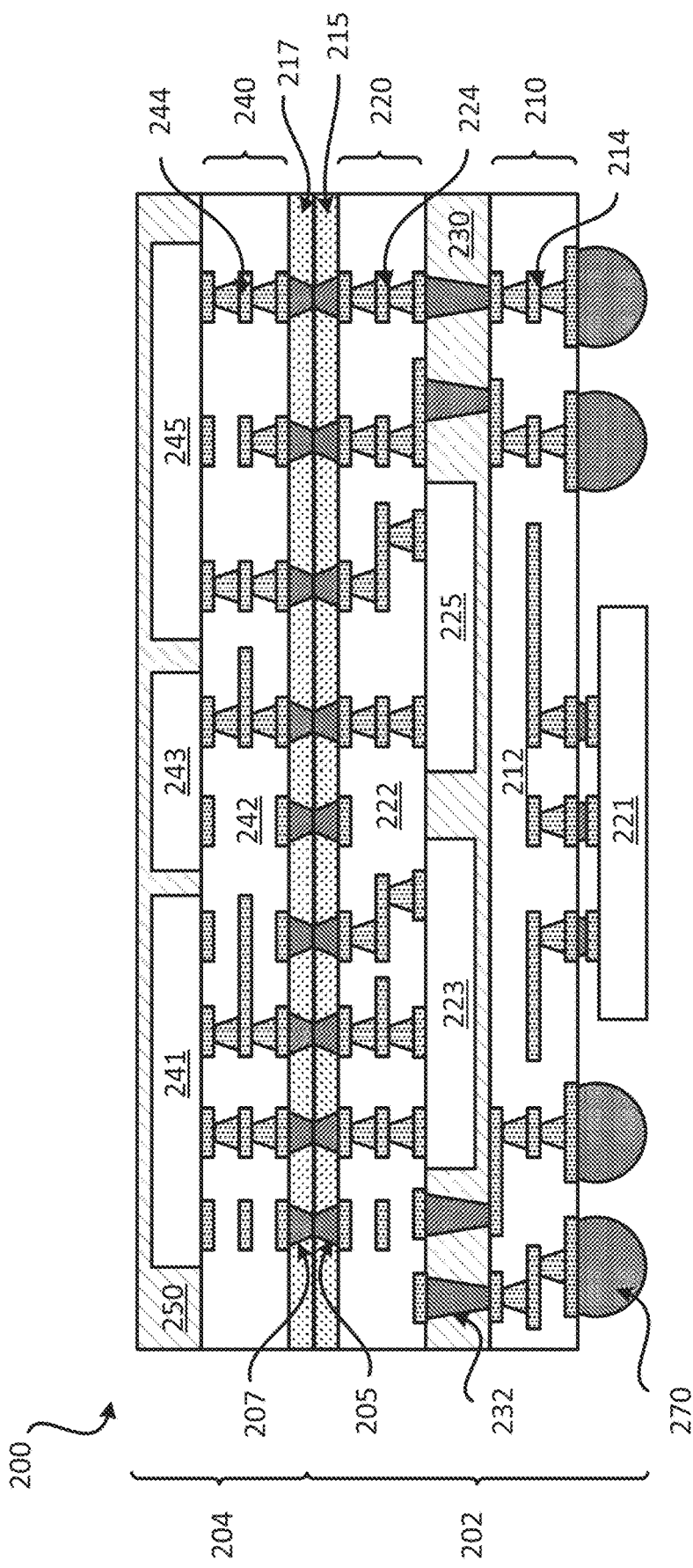
FIG. 2 illustrates a profile view of an exemplary device that includes packages coupled through contact to contact coupling.

FIG. 2 illustrates an example of a device 200 that includes a first package 202 and a second package 204. As will be further described below, the first package 202 and the second package 204 is coupled to each other through oxide to oxide coupling and/or contact to contact coupling (e.g., copper to copper hybrid bonding), which may help reduce the overall form factor of the device 200. Moreover, reducing the form factor of the device 200 allows components to be closer to each other, which may help with the overall performance of the device 200 and/or components of the device 200. For example, passive devices in one package may be able to be closer to integrated devices in another package, which may help improve the performance of the integrated devices.

As shown in FIG. 2, the first package 202 includes a first plurality of contacts 205 (e.g., copper contact), an oxide layer 215, a passive device 221, an integrated device 223 (e.g., first integrated device), an integrated device 225, a redistribution portion 210 (e.g., first redistribution portion), a redistribution portion 220 (e.g., third redistribution portion), a first encapsulation layer 230, and a plurality solder interconnects 270. The integrated device 223 and/or the integrated device 225, may include a die (e.g., semiconductor bare die).

The redistribution portion 210 may be a front side redistribution portion, and the redistribution portion 220 may be a back side redistribution portion. The redistribution portion 210 may include at least one dielectric layer 212 and a first plurality of interconnects 214. The first plurality of interconnects 214 may include traces, pads and/or vias. The first plurality of interconnects 214 may include redistribution interconnects. The redistribution portion 220 may include at least one dielectric layer 222 and a third plurality of interconnects 224. The third plurality of interconnects 224 may include traces, pads and/or vias. The third plurality of interconnects 224 may include redistribution interconnects. The first plurality of contacts 205 may be coupled to the redistribution portion 220. For example, the first plurality of contacts 205 may be coupled to the third plurality of interconnects 224. As will be further described, in at least some implementations, the first plurality of contacts 205 may be coupled to the plurality of vias 232, the integrated device 223 and/or the integrated device 225. The first plurality of contacts 205 may be a form of interconnects.

The first encapsulation layer 230 encapsulates the integrated device 223 and the integrated device 225. A plurality of vias 232 (e.g., through mold vias (TMVs)) may travel through the first encapsulation layer 230, and is located laterally relative to the integrated device 223 and the integrated device 225. The redistribution portion 210 is coupled to the first encapsulation layer 230. For example, the redistribution portion 210 may be coupled to a first surface of the first encapsulation layer 230. The redistribution portion 220 is coupled to the first encapsulation layer 230. For example, the redistribution portion 220 may be coupled to a second surface of the first encapsulation layer 230. The second surface of the first encapsulation layer 230 may be on the same side as the front side of the integrated device 223 and/or the front side of the integrated device 225. The first encapsulation layer 230 may include a mold, a resin, an epoxy and/or polymer. The first encapsulation layer 230 may be means for encapsulation (e.g., first means for encapsulation).

The passive device 221 and the plurality of solder interconnects 270 are coupled to the redistribution portion 210. The passive device 221 and the plurality of solder interconnects 270 may be coupled to a side of the redistribution portion 210 that is opposite to the first encapsulation layer 230.

As shown in FIG. 2, the second package 204 includes a second plurality of contacts 207 (e.g., copper contact), an oxide layer 217, an integrated device 241, a passive device 243 (e.g., integrated passive device (IPD)), a passive device 245, a redistribution portion 240 (e.g., second redistribution portion), a second encapsulation layer 250. The integrated device 241, the passive device 243, and/or the passive device 245, may include a die (e.g., bare die).

The second encapsulation layer 250 may encapsulate the integrated device 241, the passive device 243 and the passive device 245. The second encapsulation layer 250 may include a mold, a resin, an epoxy and/or polymer. The second encapsulation layer 250 may be means for encapsulation (e.g., second means for encapsulation).

The redistribution portion 240 may be a front side redistribution portion. The redistribution portion 240 may be coupled to the second encapsulation layer 250, the integrated device 241, the passive device 243 and the passive device 245. The redistribution portion 240 may include at least one dielectric layer 242 and a second plurality of interconnects 244. The second plurality of interconnects 244 may include traces, pads and/or vias. The second plurality of interconnects 244 may include redistribution interconnects. The second plurality of contacts 207 may be coupled to the redistribution portion 240. For example, the second plurality of contacts 207 may be coupled to the second plurality of interconnects 244. As will be further described below, in at least some implementations, the second plurality of contacts 207 may be coupled to the integrated device 241, the passive device 243 and/or the passive device 245. The second plurality of contacts 207 may be a form of interconnects.

As shown in FIG. 2, the first package 202 is coupled to the second package 204 through contact to contact coupling. The first plurality of contacts 205 of the first package 202 is coupled (e.g., directly coupled) to the second plurality of contacts 207 of the second package 204. The oxide layer 215 is coupled to the oxide layer 217 (e.g., oxide to oxide bonding). In some implementations, the oxide layer 215 and the oxide layer 217 may be considered as one oxide layer. In some implementations, at least one oxide layer (e.g., 215, 217) is located between the first package 202 and the second package 204, where the at least one oxide layer (e.g., 215, 217) is located around (e.g., located laterally around) the first plurality of contacts 205 and the second plurality of contacts 207. The contact to contact coupling may include hybrid bonding and/or direct bonding. The use of contact to contact coupling and/or oxide layer to oxide layer coupling helps reduce the overall form factor of the device 200. For example, the use of contact to contact coupling and/or oxide layer to oxide layer helps reduce the overall height and/or thickness of the device 200 by reducing the number of components between coupling of packages. It is noted that the shape and/or size of the first plurality of contacts 205 and/or the second plurality of contacts 207 is exemplary. The first plurality of contacts 205 and/or the second plurality of contacts 207 may include any shape, including a rectangular shape and a square shape.

The integrated devices from the first package 202 may be electrically coupled to the passive devices from the second package 204. For example, the integrated device 225 may be coupled to the passive device 243 through the second plurality of interconnects 244, the second plurality of contacts 207, the first plurality of contacts 205 and the third plurality of interconnects 224. In some implementations, some interconnects from the first package 202 and the second package 204 may be configured as one or more passive devices. The configuration show in at least FIG. 2 illustrates that the distance the current between an integrated device and a passive device is reduced, which in turns reduces the parasitic effects of interconnects on the circuit of the package. This in turn, may help improve the performance of the integrated device, the package and the device.

Figure 3:
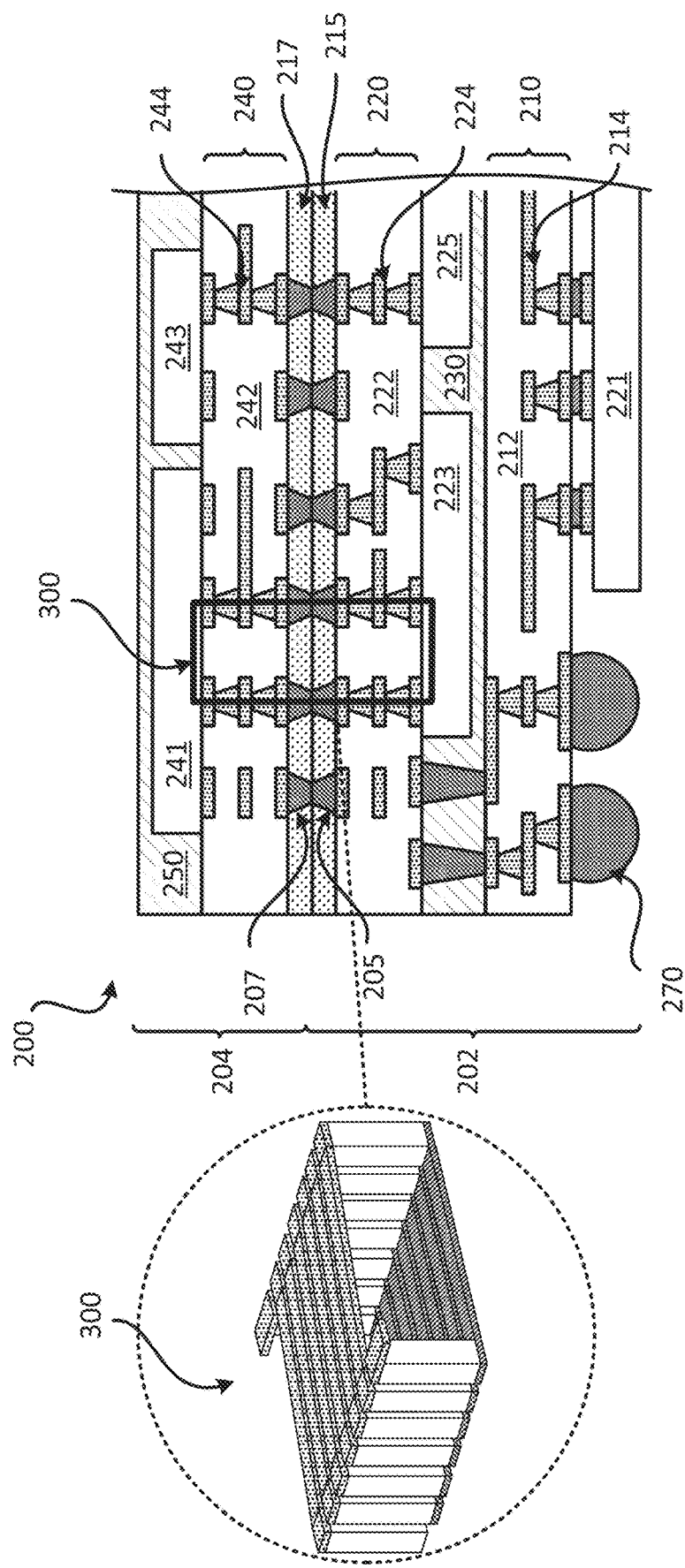
FIG. 3 illustrates a profile view of an exemplary device that includes packages coupled through contact to contact coupling.

FIG. 3 illustrates an example of how some interconnects from the first package 202 and the second package 204 may be configured as a passive device. In particular, FIG. 3 illustrates a close-up view of the device 200 that includes the first package 202 and the second package 204. As shown in FIG. 3, the device 200 includes an inductor 300 that is implemented through at least some of the second plurality of interconnects 244, the second plurality of contacts 207, the first plurality of contacts 205 and the third plurality of interconnects 224. The inductor 300 may be a solenoid inductor. The inductor 300 is implemented in both the first package 202 and the second package 204. The inductor 300 includes contacts that are coupled together through contact to contact coupling (e.g., direct contact to contact coupling), such as contacts from the first plurality of contacts 205 and the second plurality of contacts 207.

In the example of FIG. 3, the inductor 300 is configured to be electrically coupled to the integrated device 223 and the integrated device 241. However, the inductor 300 may be configured to couple to different components and/or different combinations of components (e.g., integrated devices, passive devices) of the device 200 It is noted that the shape and configuration of the inductor 300 shown is exemplary and may not be to scale. The inductor 300 may have different sizes, shapes, designs and/or locations. Moreover, the device 200 may include more than one inductor 300 having similar or different sizes, shapes and/or designs.

Figure 4:
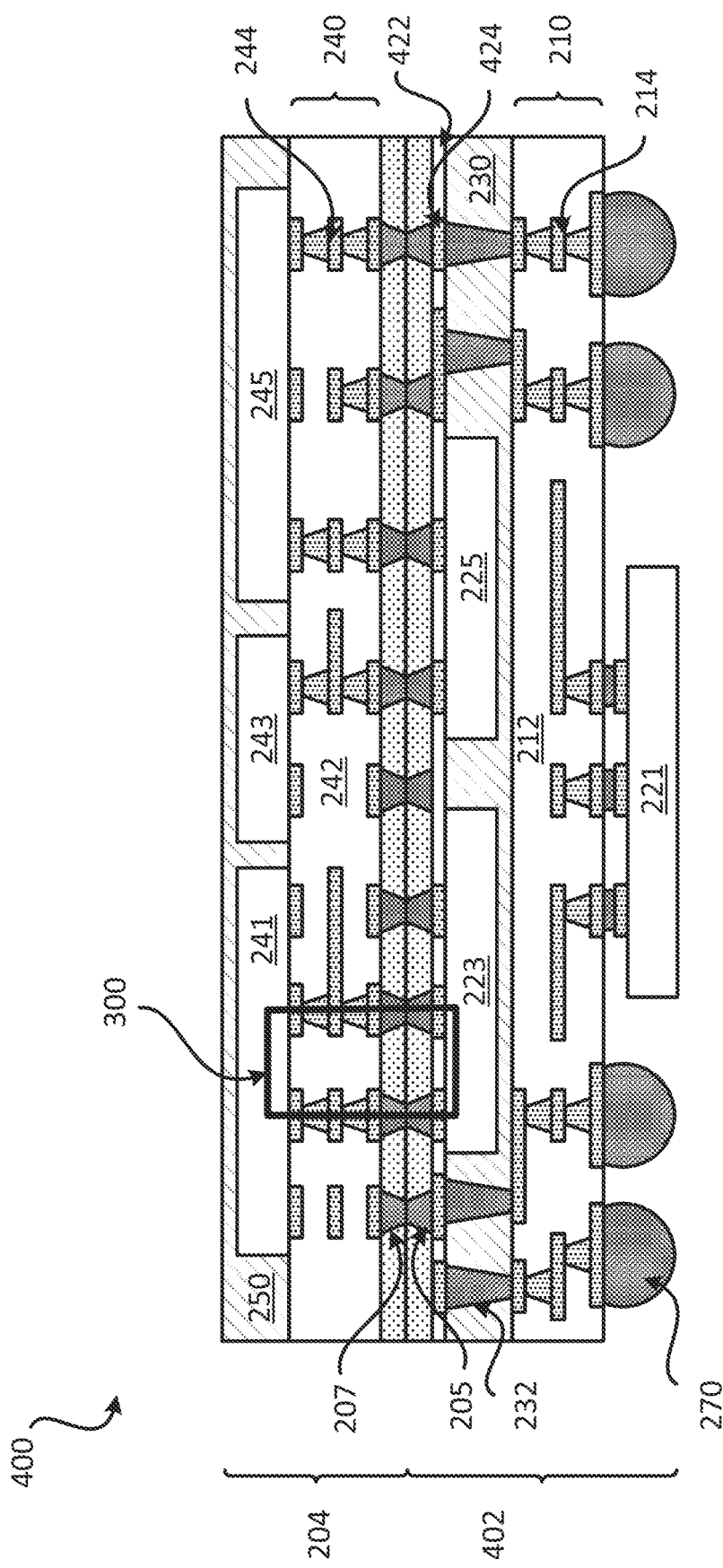
FIG. 4 illustrates a profile view of an exemplary device that includes packages coupled through contact to contact coupling.
Figure 5:
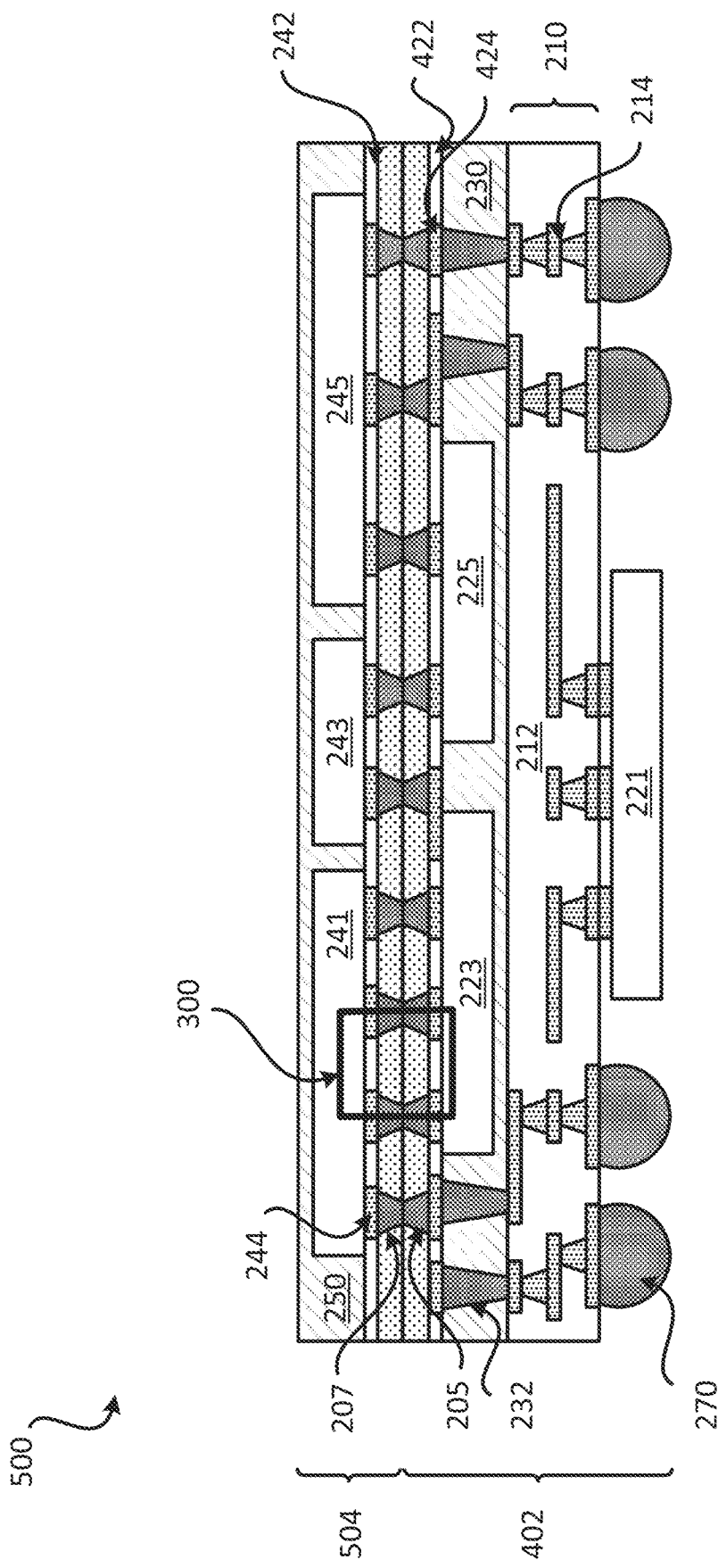
FIG. 5 illustrates a profile view of an exemplary device that includes packages coupled through contact to contact coupling.

Different implementations may include different configurations and/or arrangements of the packages. FIGS. 4 and 5 illustrate two examples of devices that include packages coupled together through contact to contact coupling. FIG. 4 illustrates a device 400 that includes the first package 402 and the second package 204. The device 400 is similar to the device 200, and may include similar components as described in the device 200. The first package 402 includes the redistribution portion 210, the passive device 221, the integrated device 223, the integrated device 225, the plurality of vias 232, the plurality of interconnects 424, and the at least one dielectric layer 422. The first plurality of contacts 205 may be coupled to the plurality of vias 232, the plurality of interconnects 424, the integrated device 223, and/or the integrated device 225.

FIG. 5 illustrates a device 500 that includes the first package 402 and the second package 504. The device 500 is similar to the device 200 and/or the device 400, and may include similar components as described in the device 200 and/or the device 400. The first package 402 is coupled to the second package 504 through contact to contact coupling. For example, the first package 402 is coupled to the second package 504 through the first plurality of contacts 205 and the second plurality of contacts 207.

The first package 402 includes the first plurality of contacts 205, the redistribution portion 210, the passive device 221, the integrated device 223, the integrated device 225, the plurality of vias 232, the plurality of interconnects 424, and the at least one dielectric layer 422. The first plurality of contacts 205 may be coupled to the plurality of vias 232, the plurality of interconnects 424, the integrated device 223, and/or the integrated device 225.

The second package 504 includes the second plurality of contacts 207, the integrated device 241, the passive device 243, the passive device 245, the second encapsulation layer 250, at least one dielectric layer 542, and the plurality of interconnects 544. The second plurality of contacts 207 may be coupled to the plurality of interconnects 544, the integrated device 241, the passive device 243, and/or the passive device 245. The second plurality of contacts 207 may be coupled to the first plurality of contacts 205 (e.g., contact to contact bonding, copper to copper bonding). The oxide layer 215 is coupled to the oxide layer 217 (e.g., oxide to oxide bonding). Once the oxide layer 215 and the oxide layer 217 are coupled (e.g., bonded) together, the oxide layer 215 and the oxide layer 217 may be considered part of the same oxide layer (e.g., may be considered as one oxide layer). The oxide layer 215 and/or the oxide layer 217 may be means for oxide coupling.

Figure 6:
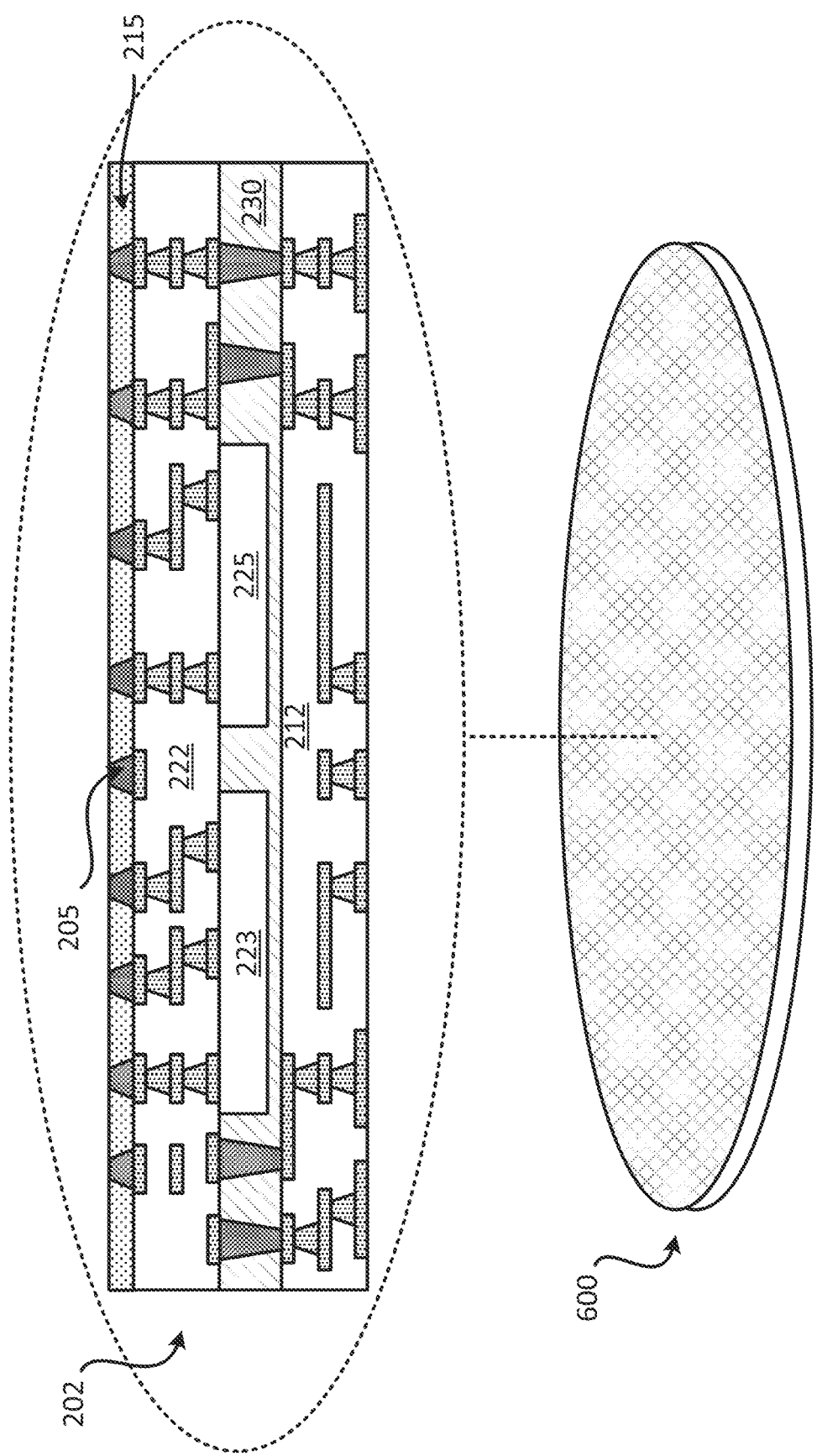
FIG. 6 illustrates a view of an exemplary wafer that includes a package with contacts for contact to contact coupling.
Figure 7:
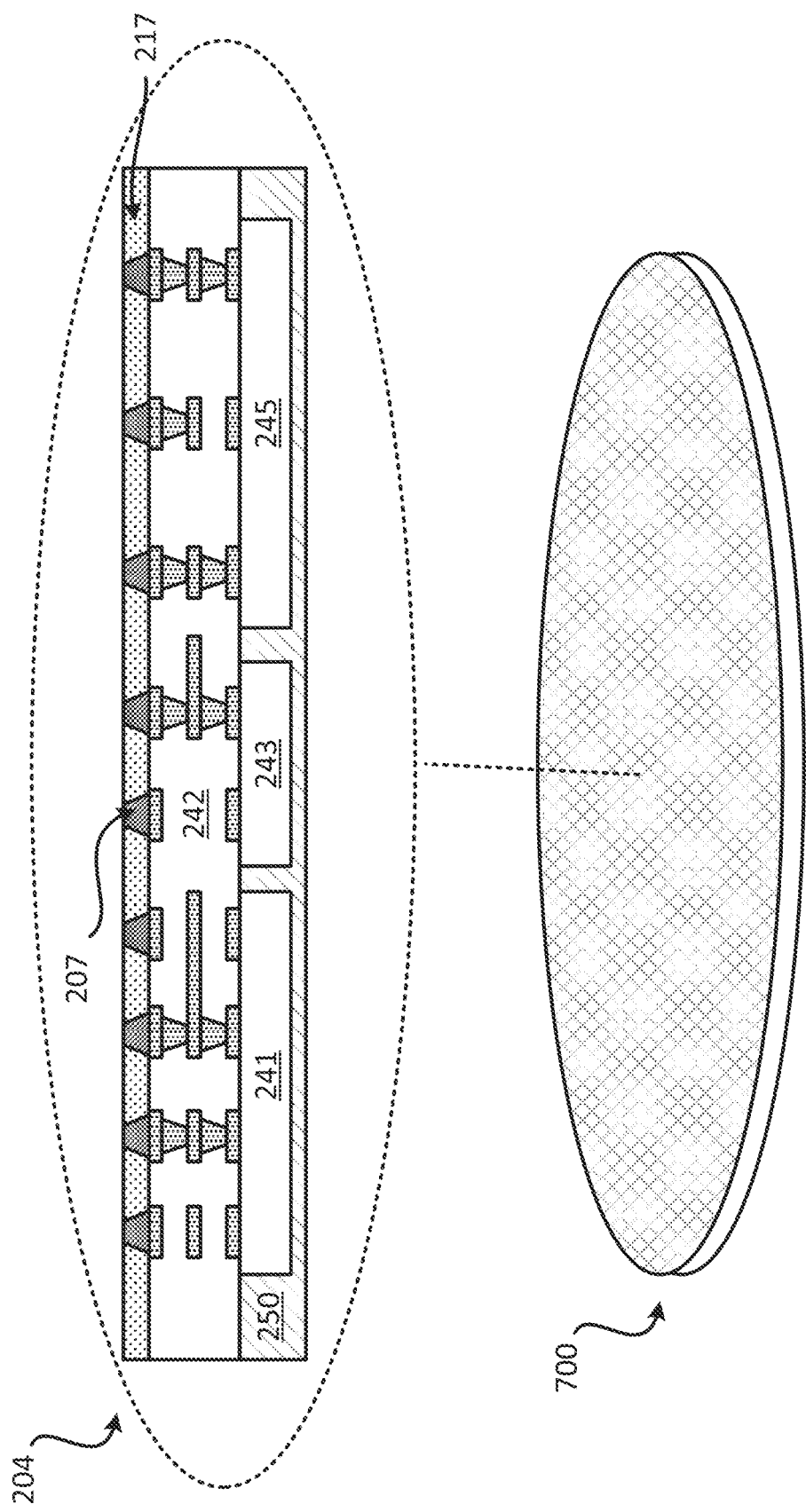
FIG. 7 illustrates a view of an exemplary wafer that includes another package with contacts for contact to contact coupling.

The first package (e.g., 202, 402) and the second package (e.g., 204, 504) may each be formed on separate wafers (e.g., reconstituted wafer). FIG. 6 illustrates a wafer 600 (e.g., reconstituted wafer) that includes a plurality of packages 202. FIG. 7 illustrates a wafer 700 (e.g., reconstituted wafer) that includes a plurality of packages 204. Different wafers may include different packages. As will be further described below, a first wafer (e.g., 600) that includes a first package (e.g., 202) may be coupled (e.g., through contact to contact coupling) to a second wafer (e.g., 700) that includes a second package (e.g., 204). The coupled wafers may be singulated (e.g., diced) to form individual devices that include the first package and the second package. It is noted that any of packages described in the disclose may be fabricated using a process that includes using a wafer.

Different implementations may use different processes for fabricating the various components and/or layers of the packages and device. Examples of processes for fabricating interconnects and/or redistribution interconnects include Semi-Additive Processing (SAP), modified Semi Additive Processing (mSAP), or a redistribution layer (RDL) fabrication process. The various processes may produce interconnects and/or redistribution interconnects with various thicknesses. As an example, when a redistribution layer (RDL) fabrication process is used to fabricate the redistribution portion (e.g., 210, 220, 240), the thickness of each of the redistribution metal layers (on which redistribution interconnects are formed) may be approximately 5-10 micrometers (μm). In contrast, interconnects that are fabricated using Semi-Additive Processing (SAP) or modified Semi Additive Processing (mSAP) for example, have a thickness that is approximately 15 micrometers (μm). The dielectric layer (e.g., 212, 222, 242) may be considered as one dielectric layer. However, in some implementations, the process of forming the dielectric layer may include forming several dielectric layers over one another. In some implementations, when a redistribution layer (RDL) fabrication process is used, each dielectric layer may have a thickness that is approximately 5-10 micrometers (μm). In contrast, when SAP or mSAP is used to form the dielectric layers, each dielectric layer may be approximately 20-25 micrometers (μm). In some implementations, each redistribution interconnects from the first plurality of interconnects 214 (e.g., redistribution interconnects), the second plurality of interconnects 244 (e.g., redistribution interconnects), and/or the third plurality of interconnects 224 (e.g., redistribution interconnects), may comprise a thickness of approximately 5-10 micrometers (μm).

An integrated device (e.g., 223, 225, 241) may include a die (e.g., bare die). The integrated device may include a radio frequency (RF) device, a passive device, a filter, a capacitor, an inductor, an antenna, a transmitter, a receiver, a surface acoustic wave (SAW) filters, a bulk acoustic wave (BAW) filter, a light emitting diode (LED) integrated device, a silicon carbide (SiC) based integrated device, memory, and/or combinations thereof. A passive device (e.g., 243, 245) may include a capacitor and/or inductor.

Exemplary Sequence for Fabricating a Package

In some implementations, fabricating a package includes several processes. FIGS. 8A-8E illustrate an exemplary sequence for providing or fabricating a package that includes an integrated device and at least one redistribution portion. In some implementations, the sequence of FIGS. 8A-8E may be used to provide or fabricate the package 202 of FIG. 2 and/or other packages described in the present disclosure.

It should be noted that the sequence of FIGS. 8A-8E may combine one or more stages in order to simplify and/or clarify the sequence for providing or fabricating a package. In some implementations, the order of the processes may be changed or modified. In some implementations, one or more of processes may be omitted, replaced and/or substituted without departing from the spirit of the disclosure.

Figure 8A:
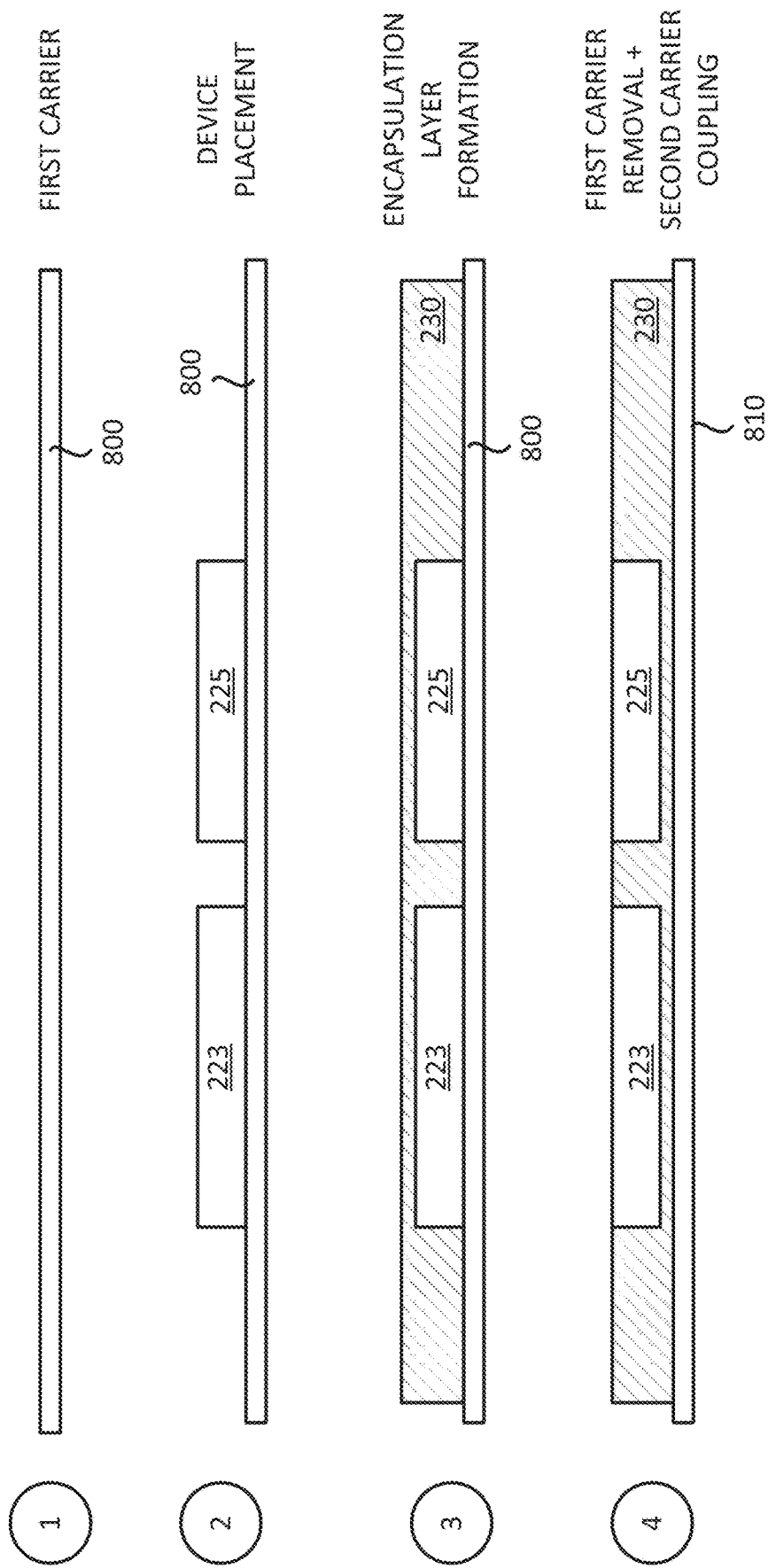
FIGS. 8A-8E illustrate an exemplary sequence for fabricating a package with contacts for contact to contact coupling.

Stage 1, as shown in FIG. 8A, illustrates a state after a carrier 800 is provided. The carrier 800 may include a wafer.

Stage 2 illustrates a state after integrated devices (e.g., 223, 225) are coupled to the carrier 800. A pick and place process may be used to place the integrated devices over the carrier 800. Different implementations may provide different devices (e.g., passive devices, integrated devices) and/or a different number of devices.

Stage 3 illustrates a state after an encapsulation layer 230 (e.g., first encapsulation layer) is provided. Different implementations may provide the encapsulation layer 230 differently. The first encapsulation layer 230 may include a mold, a resin, an epoxy and/or polymer. The process of forming and/or disposing the first encapsulation layer 230 may include using a compression and transfer molding process, a sheet molding process, or a liquid molding process.

Stage 4 illustrates a state after the carrier 800 is decoupled from the first encapsulation layer 230, and a second carrier 810 is coupled to a surface of the first encapsulation layer 230. The second carrier 810 may include a wafer.

Figure 8B:
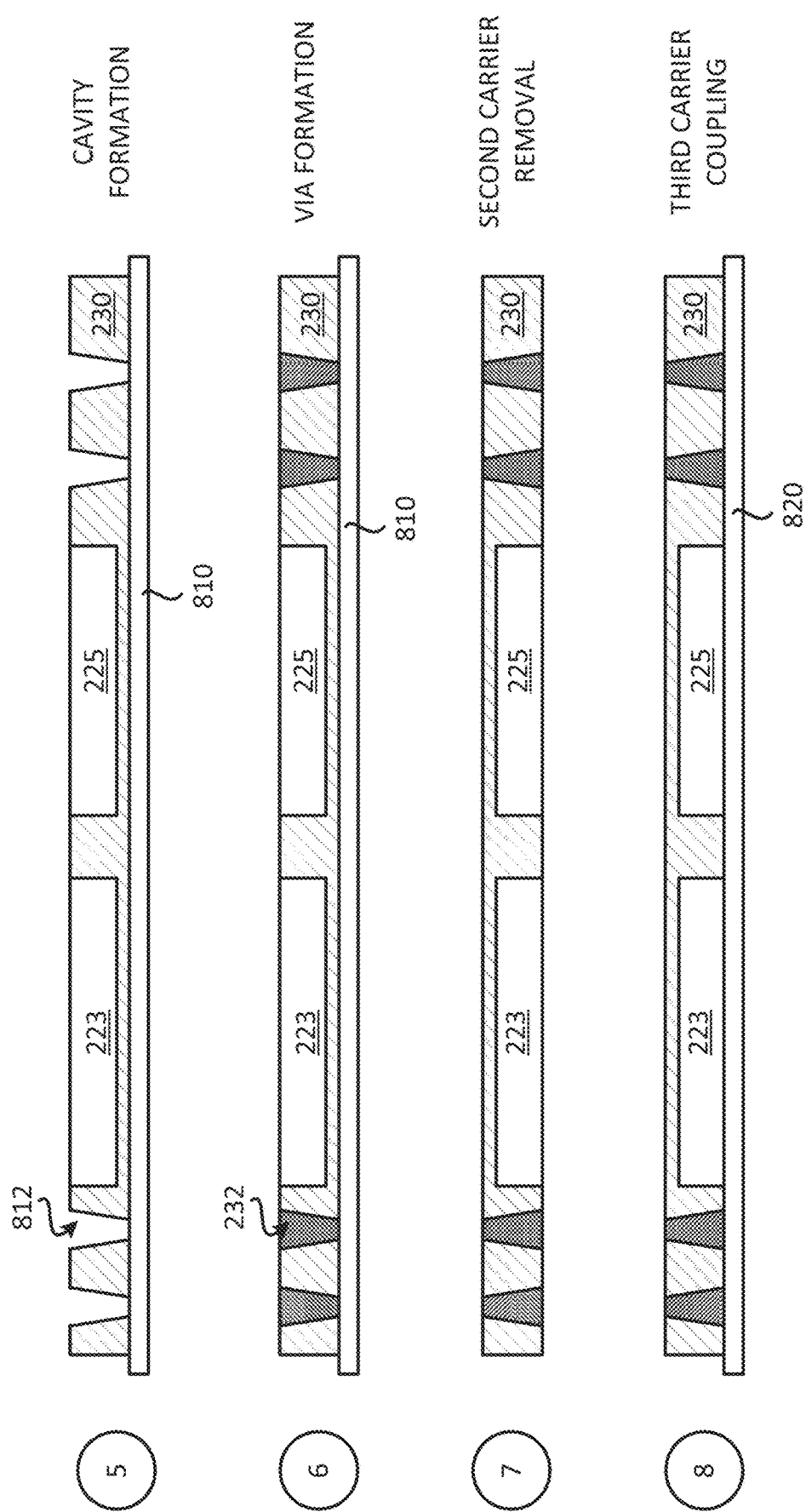

Stage 5, as shown in FIG. 8B, illustrates a state after a plurality of cavities 812 is formed in the first encapsulation layer 230. A laser process or etching process may be used to form the cavities 812. A photo etching process may be used when the first encapsulation layer 230 includes a photo imageable encapsulation layer. The shape and/or size of the cavities 812 may vary with different implementations.

Stage 6 illustrates a state after the plurality of vias 232 is formed in the cavities 812. In some implementations, a deposition process (e.g., plating process, sputtering process) may be used to form the plurality of vias 232.

Stage 7 illustrates a state after the second carrier 810 is decoupled from the first encapsulation layer 230.

Stage 8 illustrates a state after a third carrier 820 is coupled to the integrated devices (e.g., 223, 225) and the first encapsulation layer 230.

Figure 8C:
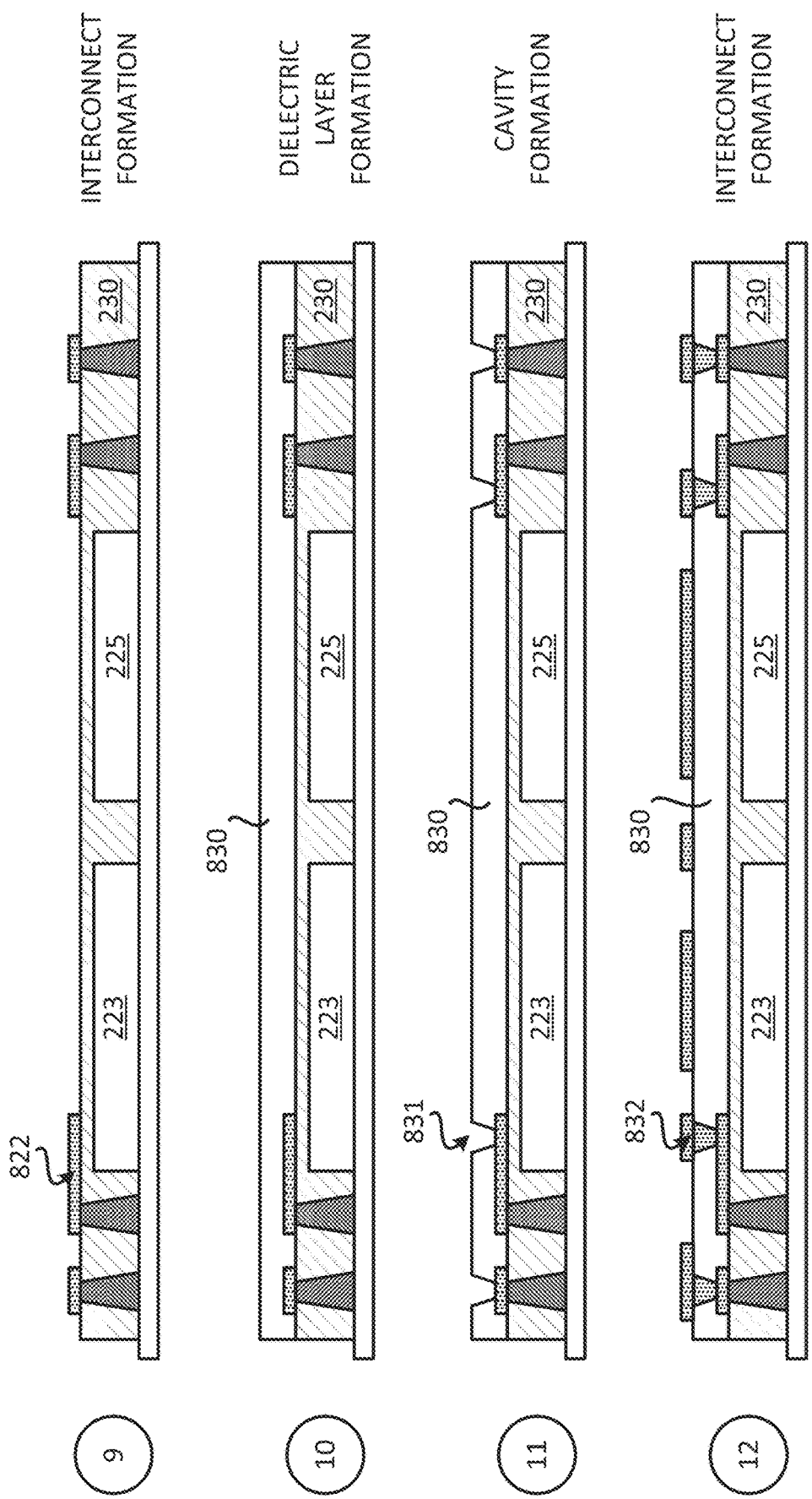

Stage 9, as shown in FIG. 8C, illustrates a state after a plurality of interconnects 822 is formed over the plurality of vias 232 and the first encapsulation layer 230. The plurality of interconnects 822 may include redistribution interconnects. Forming the plurality of interconnects 822 may include forming a seed layer, performing a lithography process, a plating process, a stripping process and/or an etching process.

Stage 10 illustrates a state after a dielectric layer 830 is formed over the first encapsulation layer 230 and the plurality of interconnects 822. A deposition process may be used to form the dielectric layer 830.

Stage 11 illustrates a state after a plurality of cavities 831 is formed in the dielectric layer 830. An etching process may be used to form the cavities 831. A photo etching process may be used when the dielectric layer 830 includes a photo imageable dielectric layer.

Stage 12 illustrates a state after a plurality of interconnects 832 is formed over the plurality of cavities 831 and the dielectric layer 830. The plurality of interconnects 832 may include redistribution interconnects. Forming the plurality of interconnects 832 may include forming a seed layer, performing a lithography process, a plating process, a stripping process and/or an etching process.

Figure 8D:
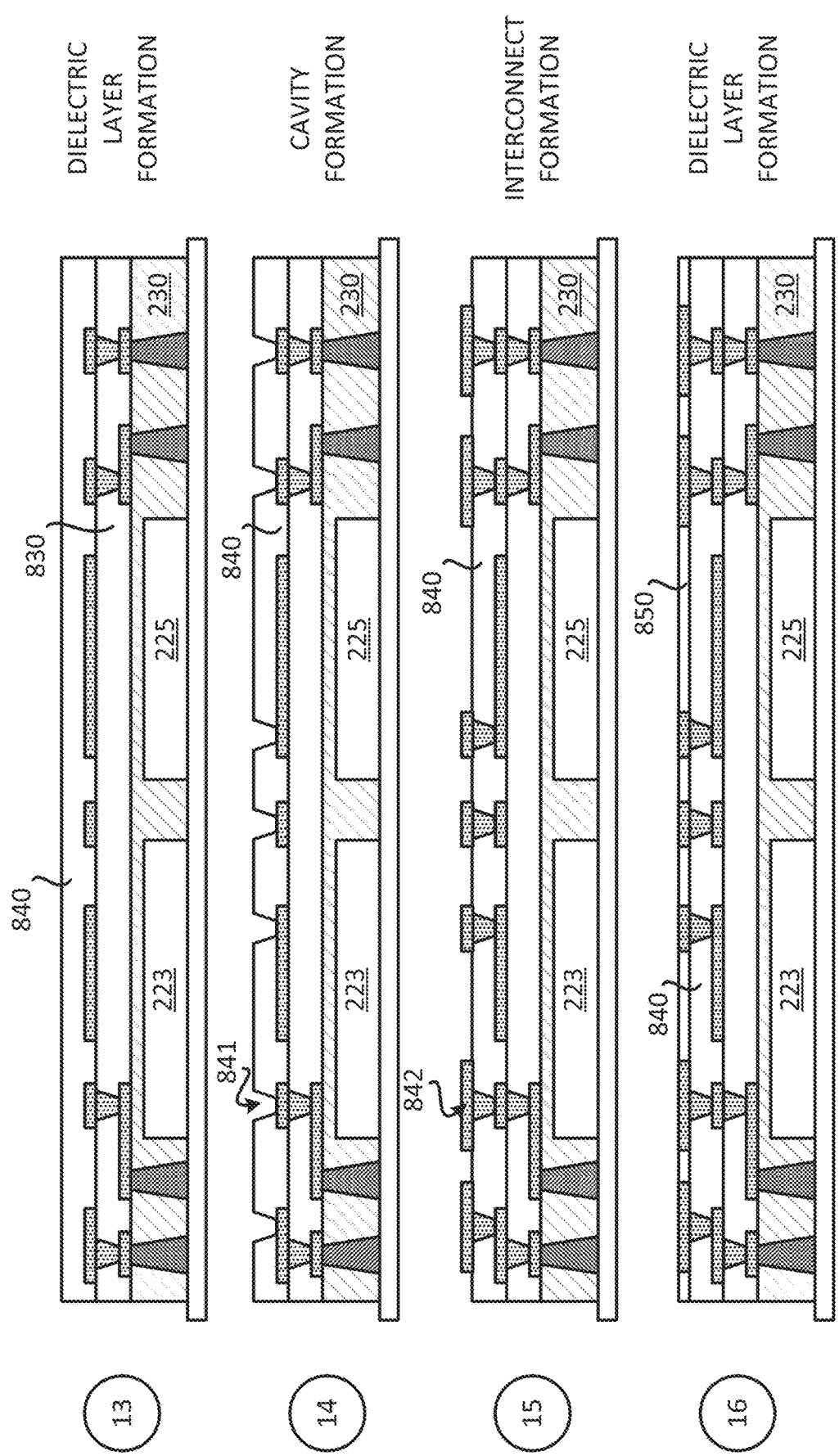

Stage 13, as shown in FIG. 8D, illustrates a state after a dielectric layer 840 is formed over the dielectric layer 830 and the plurality of interconnects 832. A deposition process may be used to form the dielectric layer 840.

Stage 14 illustrates a state after a plurality of cavities 841 is formed in the dielectric layer 840. An etching process may be used to form the cavities 841. A photo etching process may be used when the dielectric layer 840 includes a photo imageable dielectric layer.

Stage 15 illustrates a state after a plurality of interconnects 842 is formed over the plurality of cavities 841 and the dielectric layer 840. The plurality of interconnects 842 may include redistribution interconnects. Forming the plurality of interconnects 842 may include forming a seed layer, performing a lithography process, a plating process, a stripping process and/or an etching process.

Stage 16 illustrates a state after a dielectric layer 850 is formed over the dielectric layer 840. A deposition process may be used to form the dielectric layer 850. The dielectric layer 840 may be a passivation layer.

Figure 8E:
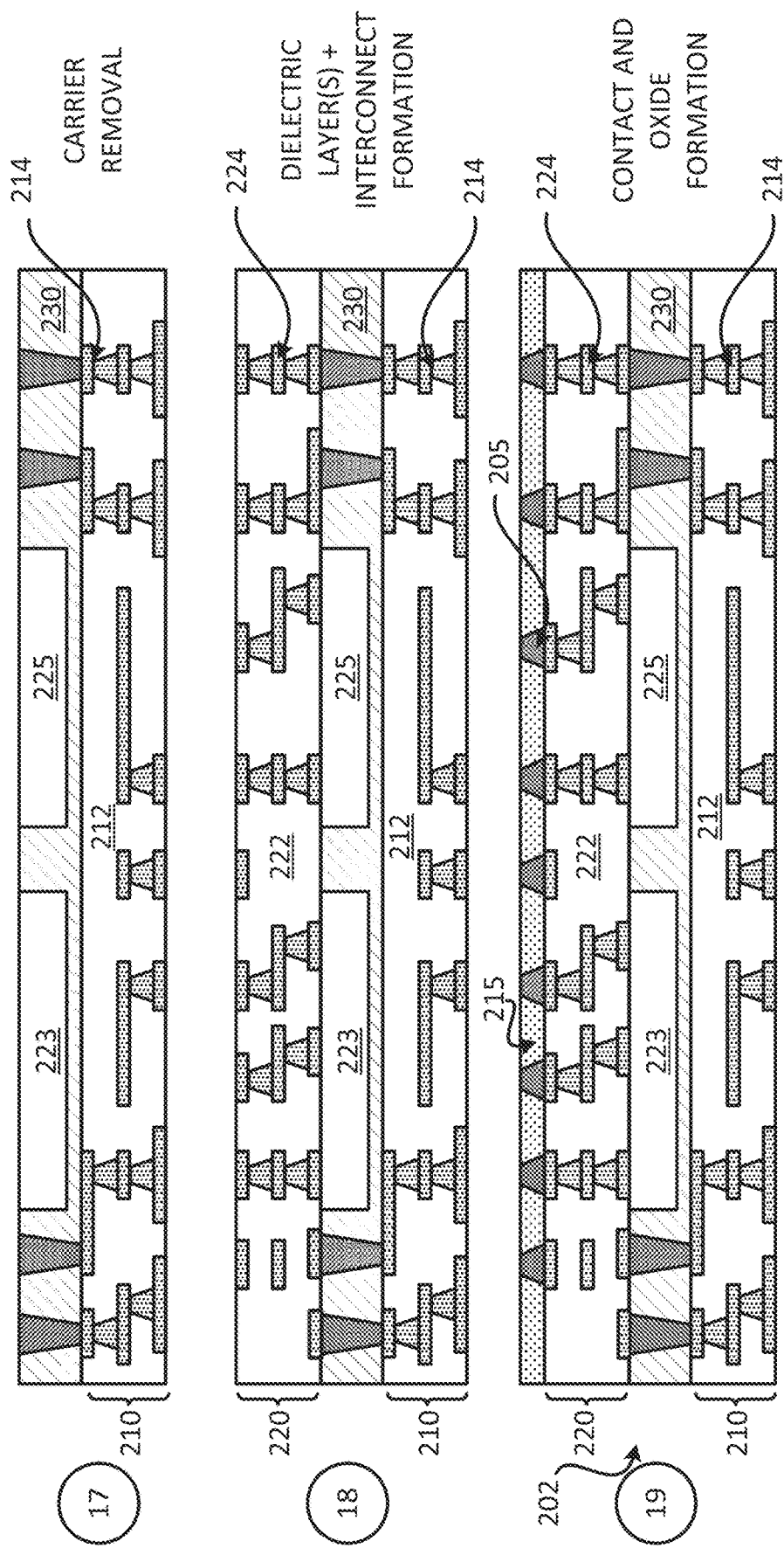

Stage 17, as shown in FIG. 8E, illustrates a state after the third carrier 820 is decoupled from the first encapsulation layer 230 and the integrated devices (e.g., 223, 225). Stage 17 illustrates the redistribution portion 210 is coupled to the first encapsulation layer 230. The redistribution portion 210 includes the at least one dielectric layer 212 and the plurality of interconnects 214. The at least one dielectric layer 212 may represent the dielectric layers 830, 840 and 850. The plurality of interconnects 214 may represent the plurality of interconnects 822, 832, and 842. The redistribution portion 210 may be a back side redistribution portion.

Stage 18 illustrates a state after the redistribution portion 220 is formed over the first encapsulation layer 230 and the integrated devices (e.g., 223, 225). The redistribution portion 220 includes the at least one dielectric layer 222 and the plurality of interconnects 224. The plurality of interconnects 224 may include redistribution interconnects. The redistribution portion 220 may be a front side redistribution portion. Forming the redistribution portion includes forming at least one dielectric layer (e.g., 222) and a plurality of interconnects (e.g., 224). A deposition process may be used to form the at least one dielectric layer 222. Forming the plurality of interconnects 224 may include forming a seed layer, performing a lithography process, a plating process, a stripping process and/or an etching process.

Stage 19 illustrates a state after a first plurality of contacts 205 and an oxide layer 215 are formed over the redistribution portion 220. A deposition process (e.g., plating process, sputtering process) may be used to form the first plurality of contacts 205. However, different implementations may use different processes to form the first plurality of contacts 205. Another deposition process may be used to form the oxide layer 215. It is noted that the shape and/or orientation of the first plurality of contacts 205 is merely exemplary. Different implementations may have the first plurality of contacts 205 with different shapes and/or orientations. Stage 19 may illustrate the package 202 as described in FIGS. 2 and 3. Stage 19 may illustrate the package 202. The package 202 may be one or several packages that are formed in a wafer (e.g., reconstituted wafer), as described in FIG. 6.

Exemplary Sequence for Fabricating a Package

Figure 9A:
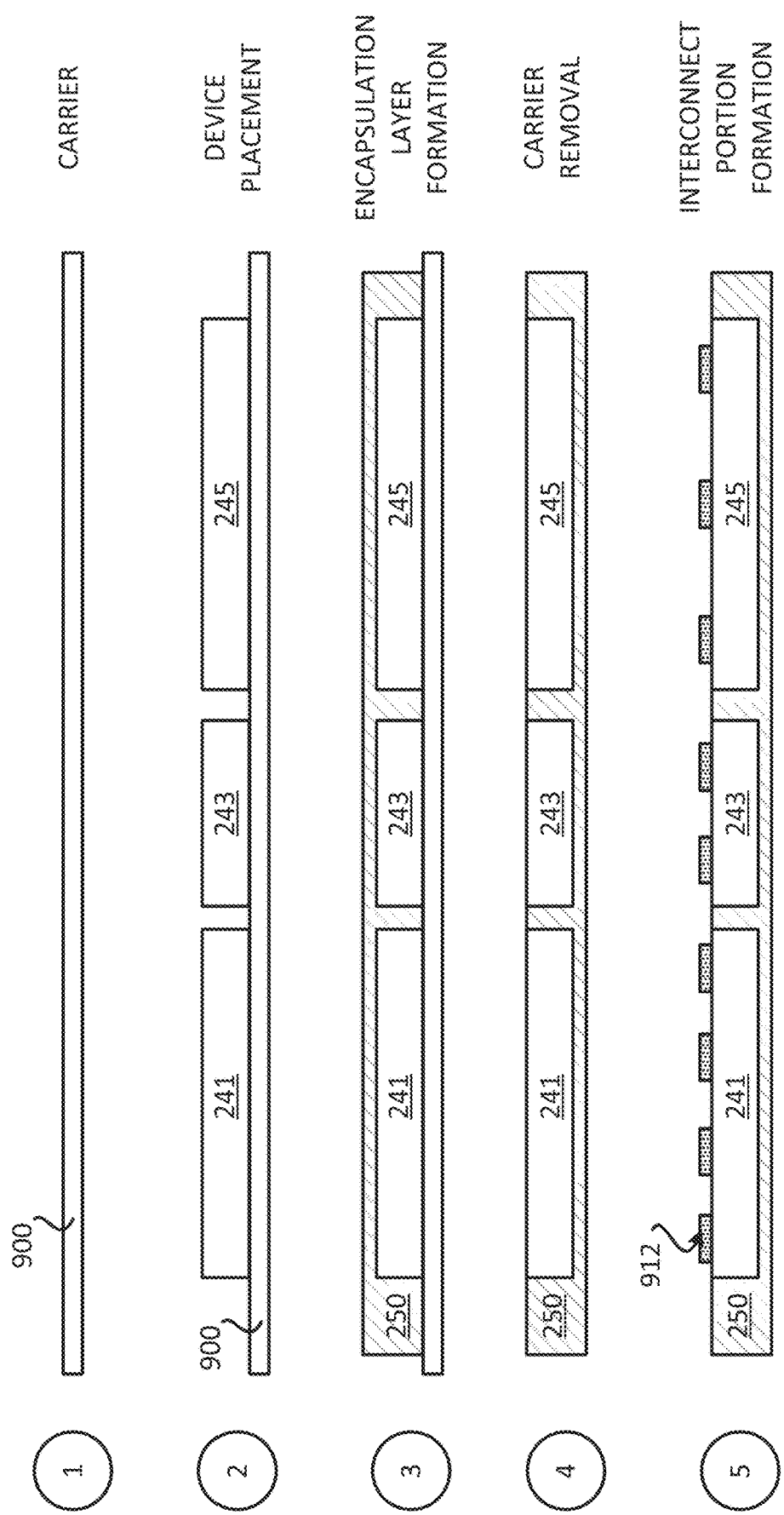
FIGS. 9A-9C illustrate an exemplary sequence for fabricating another package with contacts for contact to contact coupling.
Figure 9B:
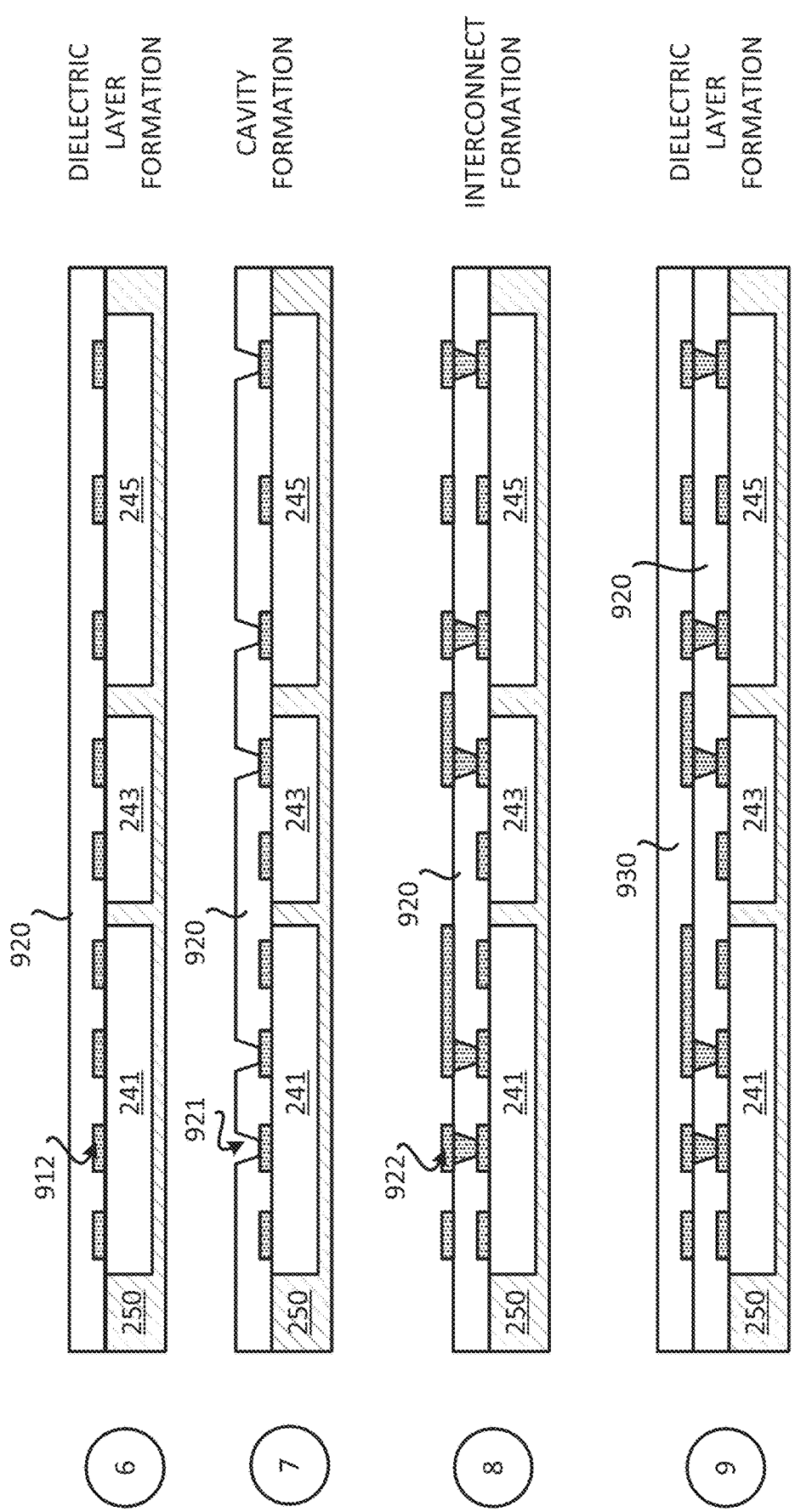
Figure 9C:
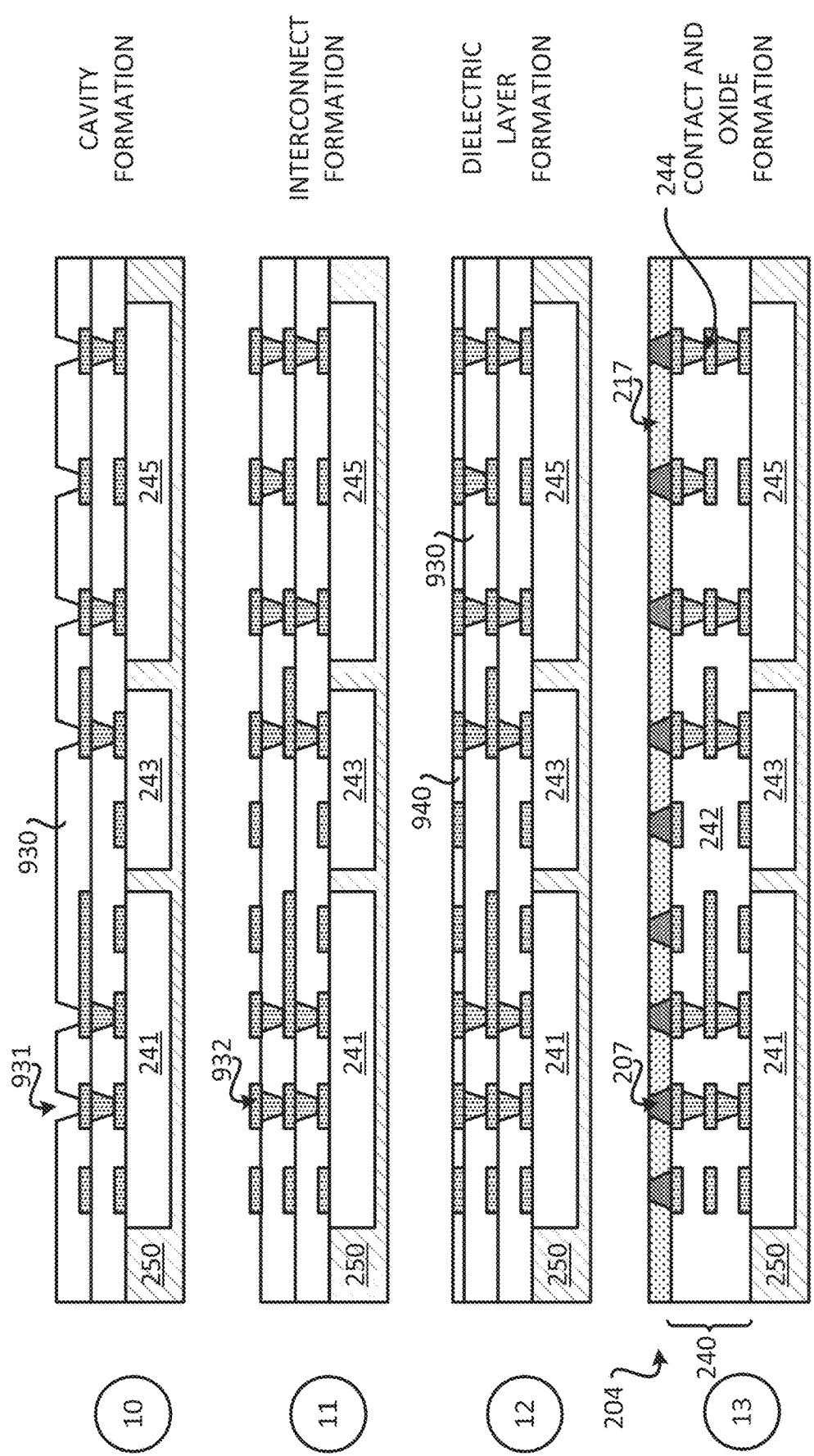

In some implementations, fabricating a package includes several processes. FIGS. 9A-9C illustrate an exemplary sequence for providing or fabricating a package that includes a passive device and at least one redistribution portion. In some implementations, the sequence of FIGS. 9A-9C may be used to provide or fabricate the package 204 of FIG. 2 and/or other packages described in the present disclosure.

It should be noted that the sequence of FIGS. 9A-9C may combine one or more stages in order to simplify and/or clarify the sequence for providing or fabricating a package. In some implementations, the order of the processes may be changed or modified. In some implementations, one or more of processes may be omitted, replaced and/or substituted without departing from the spirit of the disclosure.

Stage 1, as shown in FIG. 9A, illustrates a state after a carrier 900 is provided. The carrier 900 may include a wafer.

Stage 2 illustrates a state after an integrated device (e.g., 241) passive devices (e.g., 243, 245) are coupled to the carrier 900. A pick and place process may be used to place the passive devices over the carrier 900. Different implementations may provide different devices (e.g., passive devices, integrated devices) and/or a different number of devices.

Stage 3 illustrates a state after an encapsulation layer 250 (e.g., second encapsulation layer) is provided. Different implementations may provide the encapsulation layer 250 differently. The second encapsulation layer 250 may include a mold, a resin, an epoxy and/or polymer. The process of forming and/or disposing the second encapsulation layer 250 may include using a compression and transfer molding process, a sheet molding process, or a liquid molding process.

Stage 4 illustrates a state after the carrier 900 is decoupled from the first encapsulation layer 230.

Stage 5 illustrates a state after a plurality of interconnects 912 is formed over the integrated device (e.g., 241) and the passive devices (e.g., 243, 245). The plurality of interconnects 912 may include redistribution interconnects. Forming the plurality of interconnects 912 may include forming a seed layer, performing a lithography process, a plating process, a stripping process and/or an etching process.

Stage 6, as shown in FIG. 9B, illustrates a state after a dielectric layer 920 is formed over the second encapsulation layer 250, the integrated device 241, the passive devices (e.g., 243, 245) and the plurality of interconnects 912. A deposition process may be used to form the dielectric layer 920.

Stage 7 illustrates a state after a plurality of cavities 921 is formed in the dielectric layer 920. An etching process may be used to form the cavities 921. A photo etching process may be used when the dielectric layer 920 includes a photo imageable dielectric layer.

Stage 8 illustrates a state after a plurality of interconnects 922 is formed over the plurality of cavities 921 and the dielectric layer 920. The plurality of interconnects 922 may include redistribution interconnects. Forming the plurality of interconnects 922 may include forming a seed layer, performing a lithography process, a plating process, a stripping process and/or an etching process.

Stage 9 illustrates a state after a dielectric layer 930 is formed over the dielectric layer 920 and the plurality of interconnects 922. A deposition process may be used to form the dielectric layer 930.

Stage 10, as shown in FIG. 9C, illustrates a state after a plurality of cavities 931 is formed in the dielectric layer 930. An etching process may be used to form the cavities 931. A photo etching process may be used when the dielectric layer 840 includes a photo imageable dielectric layer.

Stage 11 illustrates a state after a plurality of interconnects 932 is formed over the plurality of cavities 931 and the dielectric layer 930. The plurality of interconnects 932 may include redistribution interconnects. Forming the plurality of interconnects 932 may include forming a seed layer, performing a lithography process, a plating process, a stripping process and/or an etching process.

Stage 12 illustrates a state after a dielectric layer 940 is formed over the dielectric layer 930. A deposition process may be used to form the dielectric layer 940. The dielectric layer 940 may be a passivation layer.

Stage 13 illustrates a state after a second plurality of contacts 207 and an oxide layer 217 are formed over the redistribution portion 240. A deposition process (e.g., plating process, sputtering process) may be used to form the second plurality of contacts 207. However, different implementations may use different processes to form the second plurality of contacts 207. Another deposition process may be used to form the oxide layer 217. It is noted that the shape and/or orientation of the second plurality of contacts 207 is merely exemplary. Different implementations may have the second plurality of contacts 207 with different shapes and/or orientations. For example, the second plurality of contacts 207 may be formed to be aligned like the vias from the plurality of interconnects 244. Stage 13 may illustrate the package 204 as described in FIGS. 2 and 3. Stage 13 may illustrate the package 204. The package 204 may be one or several packages that are formed in a wafer (e.g., reconstituted wafer), as described in FIG. 7.

Figure 10A:
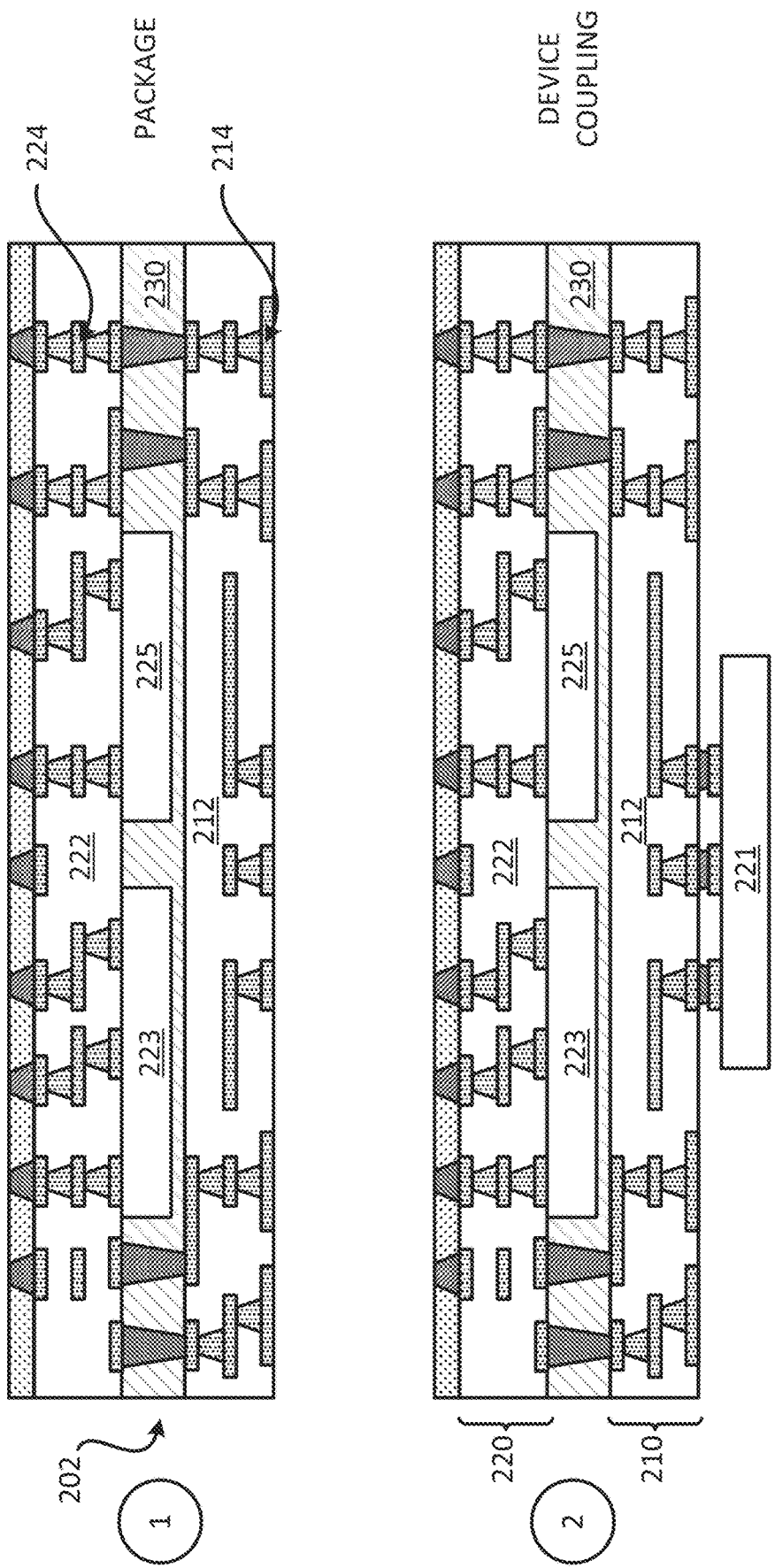
FIGS. 10A-10B illustrate an exemplary sequence for fabricating a device that includes packages coupled through contact to contact coupling.
Figure 10B:
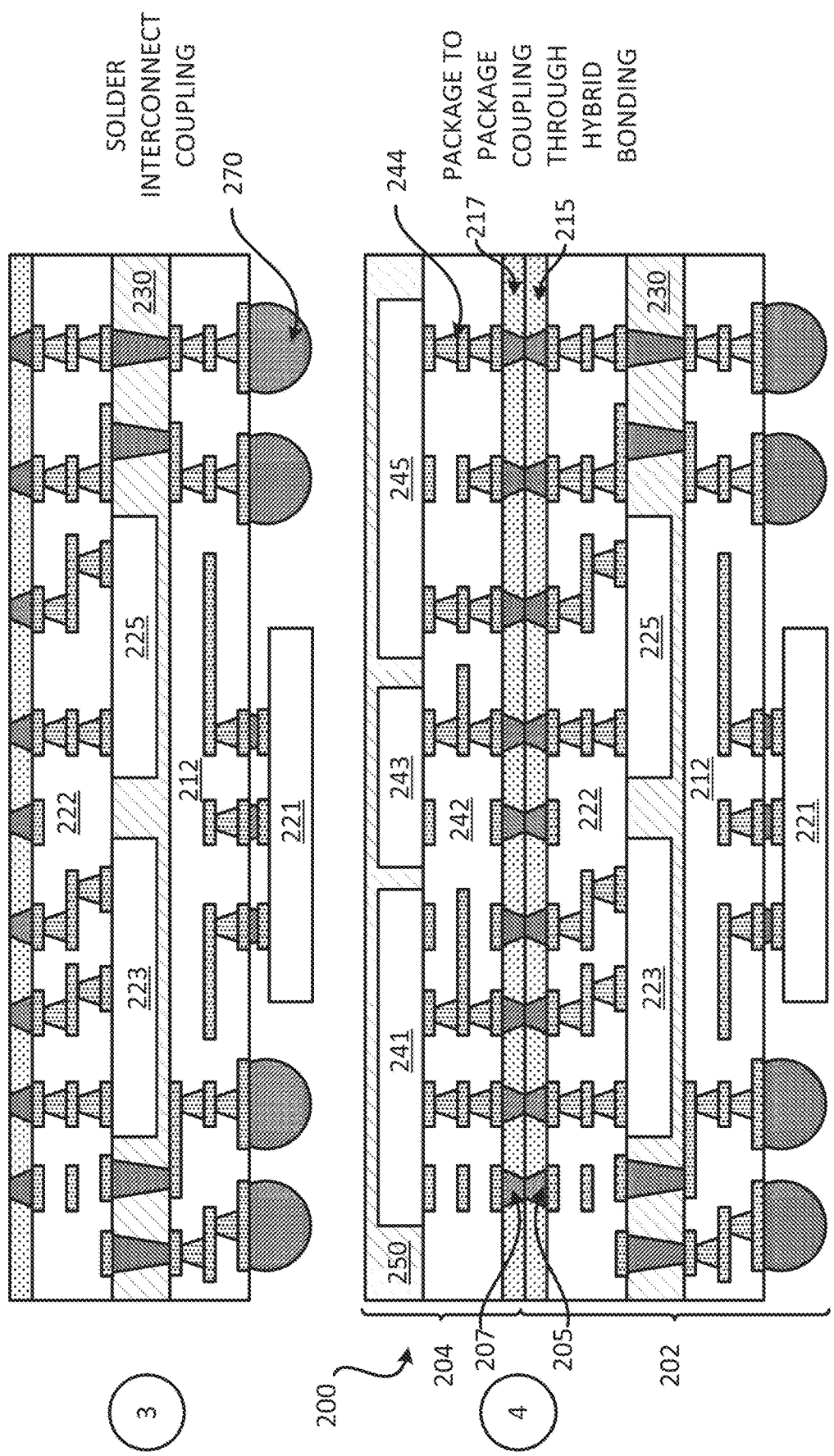

Exemplary Sequence for Fabricating a Device Comprising Packages Coupled Through Contact to Contact Coupling In some implementations, fabricating a device comprising packages with contact to contact coupling includes several processes. FIGS. 10A-10B illustrate an exemplary sequence for providing or fabricating a device comprising packages with contact to contact coupling. In some implementations, the sequence of FIGS. 10A-10B may be used to provide or fabricate the device 200 of FIG. 2 and/or other devices described in the present disclosure.

It should be noted that the sequence of FIGS. 10A-10B may combine one or more stages in order to simplify and/or clarify the sequence for providing or fabricating a device. In some implementations, the order of the processes may be changed or modified. In some implementations, one or more of processes may be omitted, replaced and/or substituted without departing from the spirit of the disclosure.

Stage 1, as shown in FIG. 10A, illustrates a state after a package 202 is provided. The package 202 may be fabricated using the process described in FIGS. 8A-8E. The package 202 may be part of a wafer.

Stage 2 illustrates a state after the passive device 221 is coupled to the redistribution portion 210. A front side of the passive device 221 may face the back side of the integrated device (e.g., 221, 223). The passive device 221 may be coupled using a solder interconnect. Different implementations may provide different devices (e.g., passive devices, integrated devices) and/or a different number of devices.

Stage 3 illustrates a state after a plurality of solder interconnects 270 is coupled to the redistribution portion 210. A reflow process may be used to couple the plurality of solder interconnects 270 to the redistribution portion 210.

Stage 4 illustrates a state after the second package 204 is coupled to the first package 202. The second package 204 is coupled to the first package 202 such that the second plurality of contacts 207 is coupled to the first plurality of contacts 205, and the oxide layer 215 is coupled to the oxide layer 217. A hybrid bonding process may be used to couple the second package 204 to the first package 202. The second package 204 may be part of a wafer. In at least some implementations, a second wafer that includes a plurality of second packages 204 is coupled to a first wafer that includes a plurality of first packages 202. The wafers may be singulated into individual devices that includes packages that are coupled to each other through hybrid bonding. In some implementations, hybrid bonding may include coupling through oxide to oxide bonding at room temperature, followed by contact to contact bonding (e.g., copper to copper bonding) through thermal compression bonding.

Figure 11:
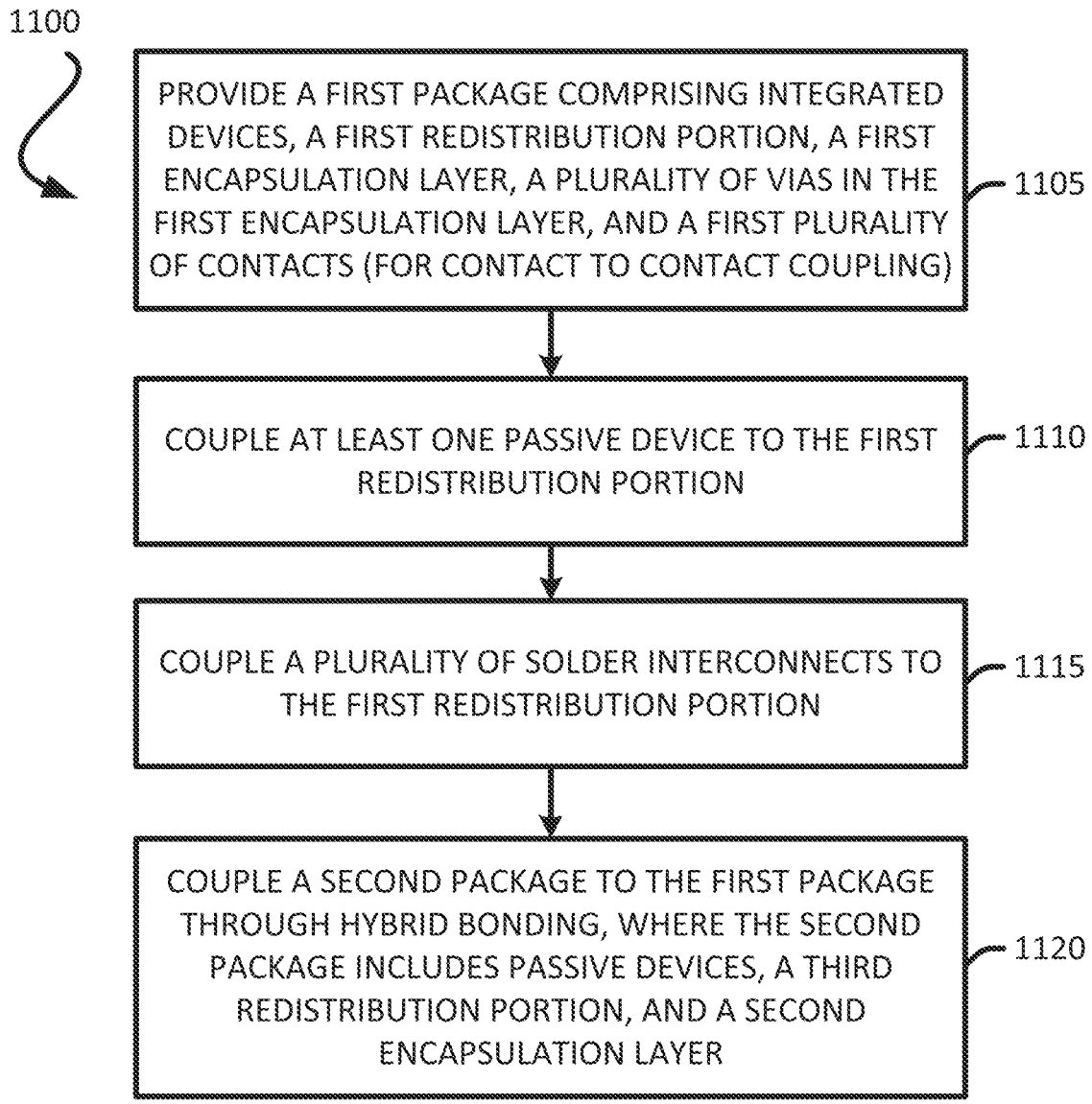
FIG. 11 illustrates an exemplary flow diagram of a method for fabricating a device that includes packages coupled through contact to contact coupling.

Exemplary Flow Diagram of a Method for Fabricating a Device Comprising Packages Coupled Through Contact to Contact Coupling In some implementations, providing a device comprising packages with contact to contact coupling includes several processes. FIG. 11 illustrates an exemplary flow diagram of a method 1100 for providing or fabricating a device comprising packages with contact to contact coupling. In some implementations, the method 1100 of FIG. 11 may be used to provide or fabricate the device of FIG. 2 and/or other devices described in the present disclosure.

It should be noted that the method of FIG. 11 may combine one or more processes in order to simplify and/or clarify the method for providing or fabricating a device comprising packages with contact to contact coupling. In some implementations, the order of the processes may be changed or modified.

The method provides (at 1105) a first package (e.g., 202) that includes integrated devices (e.g., 223), at least one redistribution portion (e.g., 210, 220), and a plurality of contacts (e.g., 205). FIGS. 8A-8E illustrate an example of a package that is fabricated. The package 202 may be part of a wafer.

The method couples (at 1110) a passive device (e.g., 221) to a redistribution portion (e.g., 210) of the package (e.g., 202). The passive device may be coupled to the redistribution portion such that a front side of the passive device 221 may face the back side of the integrated device (e.g., 221, 223). The passive device 221 may be coupled using a solder interconnect. Different implementations may provide different devices (e.g., passive devices, integrated devices) and/or a different number of devices. Stage 2 of FIG. 10A illustrates an example of a passive device coupled to redistribution portion of a package.

The method couples (at 1115) a plurality of solder interconnects (e.g., 270) to the redistribution portion (e.g. 210) of the package (e.g., 202). A reflow process may be used to couple the plurality of solder interconnects 270 to the redistribution portion 210. Stage 3 of FIG. 10B illustrates an example of a plurality of solder interconnects coupled to the redistribution portion of a package.

The method couples (at 1120) a second package (e.g., 204) to the package (e.g., 202) through hybrid bonding, which may include direct oxide to oxide bonding (e.g., coupling of oxide layer to oxide layer) and/or direct contact to contact bonding. The second package (e.g., 204) may include passive devices and a redistribution portion. The second package may be part of a wafer. FIGS. 9A-9C illustrate an example of fabricating a package that includes a plurality of contacts for contact to contact coupling. Stage 4 of FIG. 10B illustrates an example of the second package coupled to a first package through contact to contact coupling.

Exemplary a Device Comprising Packages Coupled Through Contact to Contact Coupling As mentioned above, different implementations may include a device that has different configurations and/or arrangements of packages.

Figure 12:
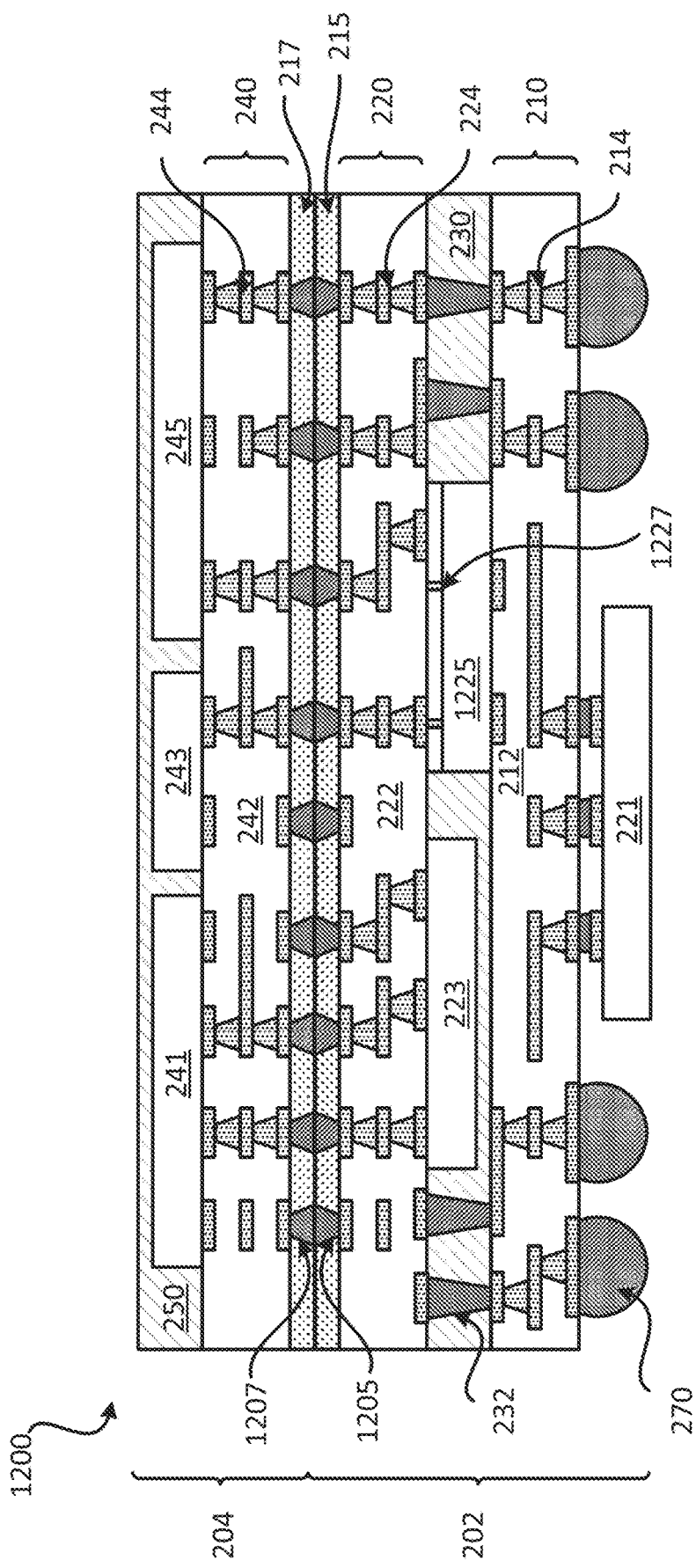
FIG. 12 illustrates a profile view of an exemplary device that includes packages coupled through contact to contact coupling.

FIG. 12 illustrates a device that include packages coupled together through contact to contact coupling. In particular, FIG. 12 illustrates a device 1200 that includes the first package 202 and the second package 204. The device 1200 is similar to the device 200, and may include similar components as described in the device 200. The first package 202 includes the integrated device 223 and the integrated device 1225. As shown in FIG. 12, the integrated device 1225 includes a front side and a back side. The integrated device 1225 includes a plurality of through substrate vias 1227. The plurality of through substrate vias 1227 may travel through a back side of the integrated device 1225. The front side of the integrated device 1225 faces and is coupled to the first redistribution portion 210. The back side of the integrated device 1225 faces and is coupled to the third redistribution portion 220. The plurality of through substrate vias 1227 may be coupled to the third redistribution portion 220. In particular, the plurality of through substrate vias 1227 may be coupled to the plurality of interconnects 224.

FIG. 12 also illustrates that the device 1200 includes the first plurality of contacts 1205 and the second plurality of contacts 1207. The first plurality of contacts 1205 may be similar to the first plurality of contacts 205. However, the first plurality of contacts 1205 may have a different shape and/or be arranged in a different orientation than the first plurality of contacts 205. The second plurality of contacts 1207 may be similar to the second plurality of contacts 207. However, the second plurality of contacts 1207 may have a different shape and/or be arranged in a different orientation than the second plurality of contacts 207. The arrangement and/or configuration of the integrated device 1225 may be implemented in any of the packages described in the disclosure.

Figure 13:
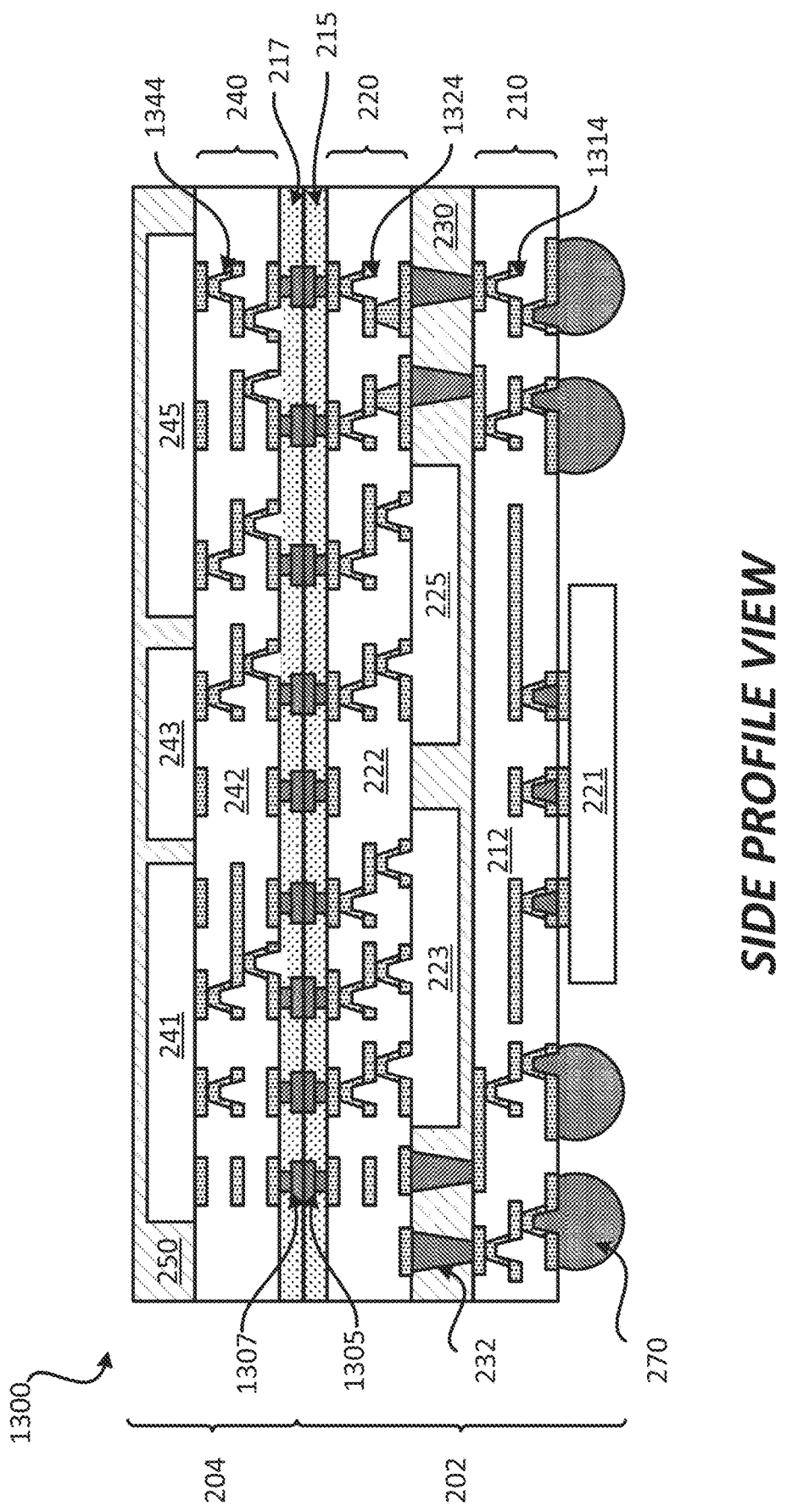
FIG. 13 illustrates a profile view of an exemplary device that includes packages coupled through contact to contact coupling.

FIG. 13 illustrates a device that include packages coupled together through contact to contact coupling. In particular, FIG. 13 illustrates a device 1300 that includes the first package 202 and the second package 204. The device 1300 is similar to the device 200, and may include similar components as described in the device 200. The first package 202 may include a plurality of redistribution interconnects 1314 in the redistribution portion 210 and a plurality of redistribution interconnects 1324 in the redistribution portion 220. The second package 204 may include a plurality of redistribution interconnects 1344 in the redistribution portion 240. The plurality of redistribution interconnects 1314, 1324 and 1344 may include interconnects include a U-shape interconnect and/or a V-shape interconnect. The terms "U-shape" and "V-shape" shall be interchangeable. The U-shape interconnect and the V-shape interconnect may have a top portion and a bottom portion. The U-shape interconnect and/or the V-shape interconnect may be formed such that a bottom portion of the U-shape interconnect (or V-shape interconnect) is coupled to a top portion of another U-shape interconnect (or V-shape interconnect). The use of a U-shape interconnect and/or a V-shape interconnect may be implemented in any of the packages described in the disclosure.

FIG. 13 also illustrates that the device 1300 includes the first plurality of contacts 1305 and the second plurality of contacts 1307. The first plurality of contacts 1305 may be similar to the first plurality of contacts 205. However, the first plurality of contacts 1305 may have a different shape and/or be arranged in a different orientation than the first plurality of contacts 205. The second plurality of contacts 1307 may be similar to the second plurality of contacts 207. However, the second plurality of contacts 1307 may have a different shape and/or be arranged in a different orientation than the second plurality of contacts 207. Moreover, the contacts in the oxide layers (e.g., 215, 217) may be coupled to other interconnects (e.g., vias, pads) in the oxide layers. The arrangement and/or configuration of the integrated device 1325 may be implemented in any of the packages described in the disclosure.

It is noted that various shapes are described for the contacts that help with the coupling of packages. Any of the shapes described for a contact may be applied to any of the packages described in the disclosure.

Exemplary Electronic Devices

Figure 14:
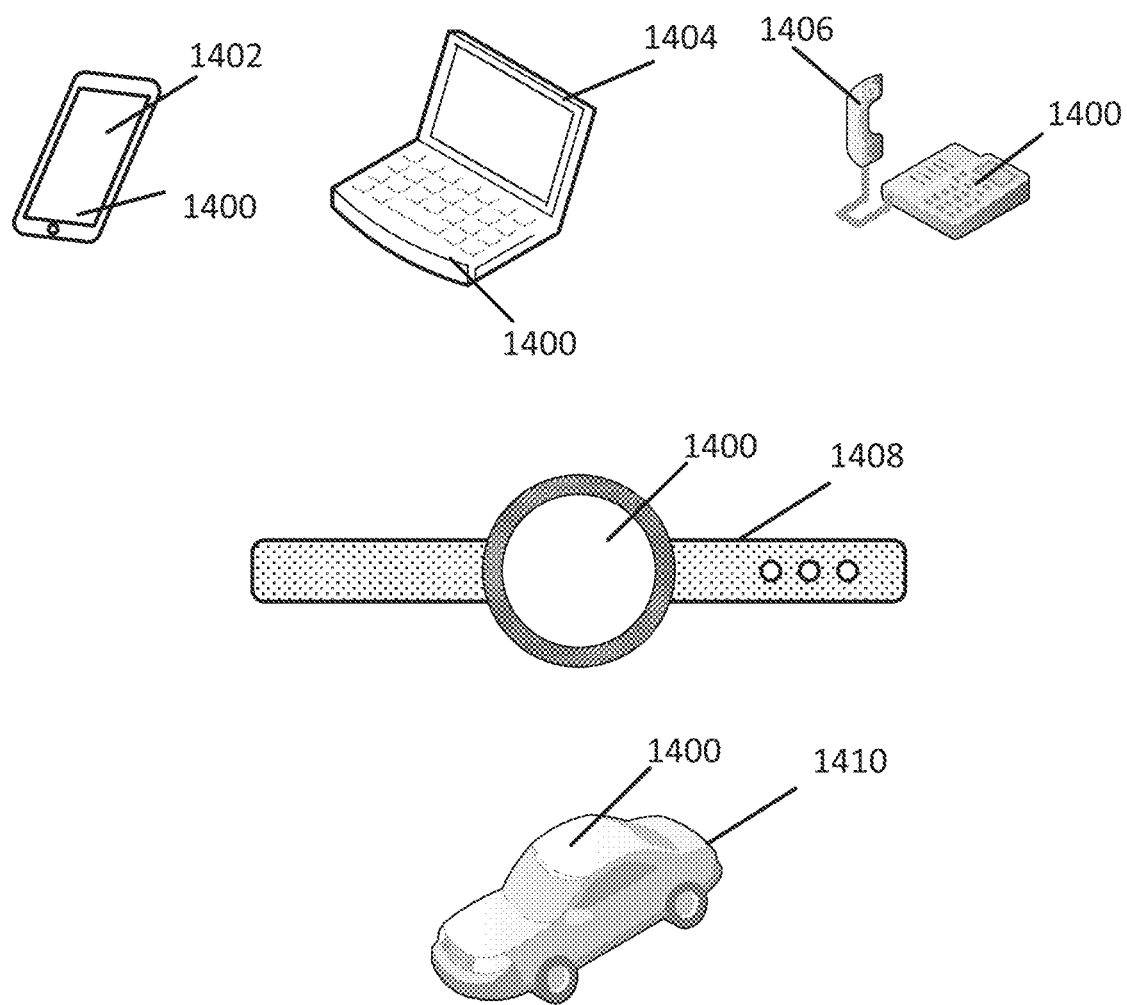
FIG. 14 illustrates various electronic devices that may integrate a die, an integrated device, an integrated passive device (IPD), a device package, a package, an integrated circuit and/or PCB described herein.

FIG. 14 illustrates various electronic devices that may be integrated with any of the aforementioned transistor, device, integrated device, integrated circuit (IC) package, integrated circuit (IC) device, semiconductor device, integrated circuit, die, interposer, package or package-on-package (PoP). For example, a mobile phone device 1402, a laptop computer device 1404, a fixed location terminal device 1406, or a wearable device 1408 may include a device 1400 as described herein. The device 1400 may be, for example, any of the devices and/or integrated circuit (IC) packages described herein. The devices 1402, 1404, 1406 and 1408 illustrated in FIG. 14 are merely exemplary. Other electronic devices may also feature the device 1400 including, but not limited to, a group of devices (e.g., electronic devices) that includes mobile devices, hand-held personal communication systems (PCS) units, portable data units such as personal digital assistants, global positioning system (GPS) enabled devices, navigation devices, set top boxes, music players, video players, entertainment units, fixed location data units such as meter reading equipment, communications devices, smartphones, tablet computers, computers, wearable devices (e.g., watches, glasses), Internet of things (IoT) devices, servers, routers, electronic devices implemented in automotive vehicles (e.g., autonomous vehicles), or any other device that stores or retrieves data or computer instructions, or any combination thereof.

One or more of the components, processes, features, and/or functions illustrated in FIGS. 2-7, 8A-8E, 9A-9C, 10A-10B, and 11-14 may be rearranged and/or combined into a single component, process, feature or function or embodied in several components, processes, or functions. Additional elements, components, processes, and/or functions may also be added without departing from the disclosure. It should also be noted FIGS. 2-7, 8A-8E, 9A-9C, 10A-10B, and 11-14 and its corresponding description in the present disclosure is not limited to dies and/or ICs. In some implementations, FIGS. 2-7, 8A-8E, 9A-9C, 10A-10B, and 11-14 and its corresponding description may be used to manufacture, create, provide, and/or produce devices and/or integrated devices. In some implementations, a device may include a die, an integrated device, an integrated passive device (IPD), a die package, an integrated circuit (IC) device, a device package, an integrated circuit (IC) package, a wafer, a semiconductor device, a package-on-package (PoP) device, and/or an interposer.

It is noted that the figures in the disclosure may represent actual representations and/or conceptual representations of various parts, components, objects, devices, packages, integrated devices, integrated circuits, and/or transistors. In some instances, the figures may not be to scale. In some instances, for purpose of clarity, not all components and/or parts may be shown. In some instances, the position, the location, the sizes, and/or the shapes of various parts and/or components in the figures may be exemplary. In some implementations, various components and/or parts in the figures may be optional.

The word "exemplary" is used herein to mean "serving as an example, instance, or illustration." Any implementation or aspect described herein as "exemplary" is not necessarily to be construed as preferred or advantageous over other aspects of the disclosure. Likewise, the term "aspects" does not require that all aspects of the disclosure include the discussed feature, advantage or mode of operation. The term "coupled" is used herein to refer to the direct or indirect coupling between two objects. For example, if object A physically touches object B, and object B touches object C, then objects A and C may still be considered coupled to one another—even if they do not directly physically touch each other. The term "electrically coupled" may mean that two objects are directly or indirectly coupled together such that an electrical current (e.g., signal, power, ground) may travel between the two objects. Two objects that are electrically coupled may or may not have an electrical current traveling between the two objects. The term "encapsulating" means that the object may partially encapsulate or completely encapsulate another object. It is further noted that the term "over" as used in the present application in the context of one component located over another component, may be used to mean a component that is on another component and/or in another component (e.g., on a surface of a component or embedded in a component). Thus, for example, a first component that is over the second component may mean that (1) the first component is over the second component, but not directly touching the second component, (2) the first component is on (e.g., on a surface of) the second component, and/or (3) the first component is in (e.g., embedded in) the second component. The term "about 'value X'", or "approximately value X", as used in the disclosure means within 10 percent of the 'value X'. For example, a value of about 1 or approximately 1, would mean a value in a range of 0.9-1.1.

In some implementations, an interconnect is an element or component of a device or package that allows or facilitates an electrical connection between two points, elements and/or components. In some implementations, an interconnect may include a trace, a via, a pad, a pillar, a redistribution metal layer, and/or an under bump metallization (UBM). An interconnect may include one or more metal components (e.g., seed layer+metal layer). In some implementations, an interconnect is an electrically conductive material that may be configured to provide an electrical path for a current (e.g., a data signal, ground or power). An interconnect may be part of a circuit. An interconnect may include more than one element or component. An interconnect may be defined by one or more interconnects. Different implementations may use similar or different processes to form the interconnects. In some implementations, a chemical vapor deposition (CVD) process and/or a physical vapor deposition (PVD) process for forming the interconnects. For example, a sputtering process, a spray coating, and/or a plating process may be used to form the interconnects.

Also, it is noted that various disclosures contained herein may be described as a process that is depicted as a flowchart, a flow diagram, a structure diagram, or a block diagram. Although a flowchart may describe the operations as a sequential process, many of the operations can be performed in parallel or concurrently. In addition, the order of the operations may be re-arranged. A process is terminated when its operations are completed.

The various features of the disclosure described herein can be implemented in different systems without departing from the disclosure. It should be noted that the foregoing aspects of the disclosure are merely examples and are not to be construed as limiting the disclosure. The description of the aspects of the present disclosure is intended to be illustrative, and not to limit the scope of the claims. As such, the present teachings can be readily applied to other types of apparatuses and many alternatives, modifications, and variations will be apparent to those skilled in the art.

What is claimed is:

1. A device comprising:
   a first package comprising:
      a first integrated device comprising a front side and a back side;
      a first encapsulation layer encapsulating the first integrated device;
      a plurality of vias traveling through the first encapsulation layer;
      a first redistribution portion comprising a first plurality of interconnects, wherein
   the first redistribution portion is coupled to the first encapsulation layer; and
      a first plurality of contacts coupled to the first integrated device through the first plurality of interconnects; and
   a second package coupled to the first package through contact to contact coupling, wherein the second package comprises:
      a passive device;
      a second encapsulation layer encapsulating the passive device;
      a second redistribution portion comprising a second plurality of interconnects,
   wherein the second redistribution portion is coupled to the passive device and the second encapsulation layer; and
      a second plurality of contacts coupled to the passive device through the second plurality of interconnects, wherein the second plurality of contacts is coupled to the first plurality of contacts from the first package; and
   at least one oxide layer located around the first plurality of contacts and the second plurality of contacts.

2. The device of claim 1, wherein the at least one oxide layer is part of the first package and/or the second package.

3. The device of claim 1, wherein the first package is coupled to the second package through hybrid bonding of the contact to contact coupling.

4. The device of claim 1, wherein the first package is coupled to the second package through direct bonding of the contact to contact coupling.

5. The device of claim 1, wherein the contact to contact coupling comprises copper to copper bonding.

6. The device of claim 1, wherein at least some of the first plurality of interconnects, the second plurality of interconnects, the first plurality of contacts and the second plurality of contacts are configured as a solenoid inductor.

7. The device of claim 1,
   wherein the first package further comprises a third redistribution portion that includes a third plurality of interconnects,
   wherein the third redistribution portion is coupled to (i) the front side of the first integrated device and (ii) the first encapsulation layer, and
   wherein the first plurality of contacts is coupled to the third redistribution portion.

8. The device of claim 1,
   wherein the second package further comprises a second integrated device,
   wherein the second encapsulation layer encapsulates the second integrated device, and
   wherein the second redistribution portion is coupled to the second integrated device.

9. The device of claim 8, wherein at least some of the first plurality of interconnects, the second plurality of interconnects, the first plurality of contacts and the second plurality of contacts, that are coupled to the first integrated device and the second integrated device, are configured as a solenoid inductor.

10. The device of claim 1, wherein the back side of the first integrated device faces the first redistribution portion.

11. The device of claim 1, wherein the front side of the first integrated device is coupled to the first redistribution portion.

12. The device of claim 1,
wherein the first plurality of interconnects includes a first plurality of redistribution interconnects,
wherein the second plurality of interconnects includes a second plurality of redistribution interconnects, and
wherein each redistribution interconnect from the first plurality of redistribution interconnects and the second plurality of redistribution interconnects, comprises a thickness of approximately 5-10 micrometers (μm).

13. The device of claim 1, wherein the device is incorporated into a particular device selected from a group consisting of a music player, a video player, an entertainment unit, a navigation device, a communications device, a mobile device, a mobile phone, a smartphone, a personal digital assistant, a fixed location terminal, a tablet computer, a computer, a wearable device, a laptop computer, a server, an internet of things (IoT) device, and a device in an automotive vehicle.

14. An apparatus comprising:
a first package comprising:
a first integrated device comprising a front side and a back side;
first means for encapsulation encapsulating the first integrated device;
a plurality of vias traveling through the first means for encapsulation;
a first redistribution portion comprising a first plurality of interconnects, wherein
the first redistribution portion is coupled to the first means for encapsulation; and
a first plurality of contacts coupled to the first integrated device; and
a second package coupled to the first package through contact to contact coupling, wherein the second package comprises:
a passive device;
second means for encapsulation encapsulating the passive device;
a second redistribution portion comprising a second plurality of interconnects,
wherein the second redistribution portion is coupled to the passive device and the second means for encapsulation; and
a second plurality of contacts coupled to the passive device, wherein the second plurality of contacts is coupled to the first plurality of contacts from the first package; and
means for oxide coupling located around the first plurality of contacts and the second plurality of contacts.

15. The apparatus of claim 14, wherein the means for oxide coupling is part of the first package and/or the second package.

16. The apparatus of claim 14, wherein the first package is coupled to the second package through hybrid bonding of the contact to contact coupling.

17. The apparatus of claim 14, wherein the first package is coupled to the second package through direct bonding of the contact to contact coupling.

18. The apparatus of claim 14, wherein at least some of the first plurality of interconnects, the second plurality of interconnects, the first plurality of contacts and the second plurality of contacts are configured as a solenoid inductor.

19. The apparatus of claim 14,
wherein the first package further comprises a third redistribution portion that includes a third plurality of interconnects,
wherein the third redistribution portion is coupled to (i) the front side of the first integrated device and (ii) the first means for encapsulation, and
wherein the first plurality of contacts is coupled to the third redistribution portion.

20. The apparatus of claim 14,
wherein the second package further comprises a second integrated device,
wherein the second means for encapsulation encapsulates the second integrated device, and
wherein the second redistribution portion is coupled to the second integrated device.

21. The apparatus of claim 20, wherein at least some of the first plurality of interconnects, the second plurality of interconnects, the first plurality of contacts and the second plurality of contacts, that are coupled to the first integrated device and the second integrated device, are configured as a solenoid inductor.

22. The apparatus of claim 14, wherein the back side of the first integrated device faces the first redistribution portion.

23. The apparatus of claim 14, wherein the front side of the first integrated device is coupled to the first redistribution portion.

24. The apparatus of claim 14, wherein the apparatus is incorporated into a device selected from a group consisting of a music player, a video player, an entertainment unit, a navigation device, a communications device, a mobile device, a mobile phone, a smartphone, a personal digital assistant, a fixed location terminal, a tablet computer, a computer, a wearable device, a laptop computer, a server, an internet of things (IoT) device, and a device in an automotive vehicle.

25. A method for fabricating a device, comprising:
providing a first package comprising:
a first integrated device comprising a front side and a back side;
a first encapsulation layer encapsulating the first integrated device;
a plurality of vias traveling through the first encapsulation layer;
a first redistribution portion comprising a first plurality of interconnects, wherein
the first redistribution portion is coupled to the first encapsulation layer; and
a first plurality of contacts coupled to the first integrated device through the first plurality of interconnects;
providing a second package comprising:
a passive device;
a second encapsulation layer encapsulating the passive device;
a second redistribution portion comprising a second plurality of interconnects,
wherein the second redistribution portion is coupled to the passive device and the second encapsulation layer; and a second plurality of contacts coupled to the passive device through the second plurality of interconnects, wherein the second plurality of contacts is coupled to the first plurality of contacts from the first package; and coupling the first package to the second package through contact to contact coupling, wherein contact to contact coupling comprises copper to copper bonding.

26. The method of claim 25, wherein coupling the first package to the second package comprises coupling the first package to the second package through oxide to oxide coupling.

27. The method of claim 25, wherein coupling the first package to the second package comprises through hybrid bonding of the contact to contact coupling.

28. The method of claim 25, wherein coupling the first package to the second package comprises through direct bonding of the contact to contact coupling.

29. The device of claim 1, wherein the at least one oxide layer is separate from the first redistribution portion and the second redistribution portion.

30. The apparatus of claim 14, wherein the first plurality of contacts is coupled to the first integrated device through the first plurality of interconnects of the first redistribution portion.

31. The apparatus of claim 30, wherein the second plurality of contacts is coupled to the passive device through the second plurality of interconnects of the second redistribution portion.

32. A device comprising:
a first package comprising:
- a first integrated device comprising a front side and a back side;
- a first encapsulation layer encapsulating the first integrated device;
- a plurality of vias traveling through the first encapsulation layer;
- a first plurality of interconnects coupled to the first integrated device and the plurality of vias; and
- a first plurality of contacts coupled to the first integrated device through the first plurality of interconnects; and a second package coupled to the first package through contact to contact coupling, wherein the second package comprises:
- a passive device;
- a second encapsulation layer encapsulating the passive device;
- a second plurality of interconnects coupled to the passive device; and
- a second plurality of contacts coupled to the passive device through the second plurality of interconnects, wherein the second plurality of contacts is coupled to the first plurality of contacts from the first package; and at least one oxide layer located around the first plurality of contacts and the second plurality of contacts.

33. The device of claim 32, wherein the first plurality of interconnects is part of a first redistribution portion of the first package.

34. The device of claim 32, wherein the second plurality of interconnects is part of a second redistribution portion of the second package.

35. The device of claim 32, wherein contact to contact coupling comprises copper to copper bonding.

36. The device of claim 32, wherein the second package is coupled to the first package through oxide to oxide coupling.

37. A device comprising:
a first package comprising:
- a first integrated device comprising a front side and a back side;
- a first encapsulation layer encapsulating the first integrated device;
- a plurality of vias traveling through the first encapsulation layer;
- a first plurality of interconnects coupled to the first integrated device and the plurality of vias; and
- a first plurality of contacts coupled to the first integrated device through the first plurality of interconnects; and a second package coupled to the first package through contact to contact coupling, wherein the second package comprises:
- a second integrated device;
- a second encapsulation layer encapsulating the second integrated device;
- a second plurality of interconnects coupled to the second integrated device; and
- a second plurality of contacts coupled to the second integrated device through the second plurality of interconnects, wherein the second plurality of contacts is coupled to the first plurality of contacts from the first package; and at least one oxide layer located around the first plurality of contacts and the second plurality of contacts.

38. The device of claim 37, wherein the first plurality of interconnects is part of a first redistribution portion of the first package.

39. The device of claim 37, wherein the second plurality of interconnects is part of a second redistribution portion of the second package.

* * * * *